US009137608B2

(12) United States Patent
Takahashi et al.

(10) Patent No.: US 9,137,608 B2
(45) Date of Patent: Sep. 15, 2015

(54) ACTUATOR, PIEZOELECTRIC ACTUATOR, ELECTRONIC DEVICE, AND METHOD FOR ATTENUATING VIBRATION AND CONVERTING VIBRATION DIRECTION

(75) Inventors: Masatake Takahashi, Tokyo (JP); Yasuharu Onishi, Tokyo (JP); Yasuhiro Sasaki, Tokyo (JP); Shigeki Shinoda, Tokyo (JP); Junichiro Mataga, Tokyo (JP); Ukyo Mori, Tokyo (JP); Jun Kuroda, Tokyo (JP); Yukio Murata, Tokyo (JP)

(73) Assignee: NEC CORPORATION, Tokyo (JP)

( * ) Notice: Subject to any disclaimer, the term of this patent is extended or adjusted under 35 U.S.C. 154(b) by 510 days.

(21) Appl. No.: 13/513,953

(22) PCT Filed: Dec. 14, 2010

(86) PCT No.: PCT/JP2010/072489
§ 371 (c)(1),
(2), (4) Date: Sep. 18, 2012

(87) PCT Pub. No.: WO2011/074579
PCT Pub. Date: Jun. 23, 2011

(65) Prior Publication Data
US 2013/0043766 A1    Feb. 21, 2013

(30) Foreign Application Priority Data
Dec. 15, 2009  (JP) ................................. 2009-283894

(51) Int. Cl.
*H01L 41/053* (2006.01)
*H04R 7/20* (2006.01)
*H04R 17/00* (2006.01)

(52) U.S. Cl.
CPC . *H04R 7/20* (2013.01); *H04R 17/00* (2013.01)

(58) Field of Classification Search
CPC .......... H01L 41/09; H02K 41/02; H04R 17/00
USPC ................. 310/330, 328, 323, 326, 348, 324; 381/190; 324/207
See application file for complete search history.

(56) References Cited

U.S. PATENT DOCUMENTS 4,677,377 A * 6/1987 Takahashi et al. ....... 324/207.12
5,705,108 A   1/1998 Nonogaki
(Continued)

FOREIGN PATENT DOCUMENTS

CN    101336562 A   12/2008
JP     58-7999 A    1/1983
(Continued)

OTHER PUBLICATIONS

Office Action, dated Feb. 27, 2014, issued by the State Intellectual Property Office of the People's Republic of China, in counterpart Application No. 201080057244.3.
(Continued)

*Primary Examiner* — Shawki S Ismail
*Assistant Examiner* — Bryan Gordon
(74) *Attorney, Agent, or Firm* — Sughrue Mion, PLLC

(57) ABSTRACT

A viscoelastic body is interposed between a vibrating membrane vibrating in association with a piezoelectric vibrator composed of a piezoelectric element and a base and a support member supporting the vibrating membrane. The viscoelastic body attenuates vibration transmitted from the support member to the vibrating membrane and converts vibration of the vibrating membrane in the surface direction parallel to its main surfaces to vibration of the vibrating membrane in the direction nearly perpendicular to the surface direction. The vibrating membrane is annular with an opening at the center, and the base is joined to the vibrating membrane coaxially with opening.

17 Claims, 16 Drawing Sheets

(56) References Cited

U.S. PATENT DOCUMENTS

| | | | | |
|---|---|---|---|---|
| 7,629,730 | B2 * | 12/2009 | Fujiwara et al. | 310/369 |
| 8,319,396 | B2 * | 11/2012 | Onishi et al. | 310/324 |
| 2008/0277103 | A1 * | 11/2008 | Yamada et al. | 165/104.33 |
| 2010/0219722 | A1 * | 9/2010 | Onishi et al. | 310/348 |
| 2011/0002485 | A1 * | 1/2011 | Onishi et al. | 381/190 |
| 2011/0255718 | A1 * | 10/2011 | Fukushima et al. | 381/190 |

FOREIGN PATENT DOCUMENTS

| JP | 64-005199 | A | 1/1989 |
|---|---|---|---|
| JP | 4-13994 | U | 2/1992 |
| JP | 09-102998 | A | 4/1997 |
| JP | 2000-217190 | A | 8/2000 |
| JP | 2001-017917 | A | 1/2001 |
| JP | 2001-339791 | A | 12/2001 |
| JP | 2002-315092 | A | 10/2002 |
| JP | 2008-219064 | A | 9/2008 |
| WO | 2007/083497 | A1 | 7/2007 |

OTHER PUBLICATIONS

International Search Report of PCT/JP2010/072489 dated Mar. 8, 2011.

Communication dated May 7, 2015 from the Japanese Patent Office in counterpart application No. 2011-546132.

* cited by examiner (A)

(B)

(C)

(A)

(B)

(A)

(B)

(A)

(B)

(A)

141

(D)

144

(B)

142

(E)

145

(C)

143

(A)

(B)

ACTUATOR, PIEZOELECTRIC ACTUATOR, ELECTRONIC DEVICE, AND METHOD FOR ATTENUATING VIBRATION AND CONVERTING VIBRATION DIRECTION

CROSS REFERENCE TO RELATED APPLICATIONS

This application is a National Stage of International Application No. PCT/JP2010/072489 filed Dec. 14, 2010, claiming priority based on Japanese Patent Application No. 2009-283894 filed Dec. 15, 2009, the contents of all of which are incorporated herein by reference in their entirety.

TECHNICAL FIELD

The present invention relates to an actuator, piezoelectric actuator, electronic device, and method for attenuating vibration and converting vibration direction.

BACKGROUND ART

Recently, there is an increasing demand for small and power-saving actuators as small communication devices such as cell-phones have widely become in use. In view of such circumstances, a variety of piezoelectric actuators using a piezoelectric element as a vibration drive source and realizing a small size and power saving have been developed. A piezoelectric element is an element having piezoelectric effect and inverse piezoelectric effect. A piezoelectric element generates a voltage when an external force such as vibration or a pressure is applied thereto and, conversely, vibrates (displaces) when a voltage is applied thereto.

A piezoelectric actuator generates mechanical vibration as a piezoelectric element within a piezoelectric vibrator vibrates. For example, as an electronic part of cell-phones, piezoelectric actuators have applications in vibration devices such as vibrators and acoustic devices such as speakers.

The piezoelectric vibrator of the above piezoelectric actuator includes those of the bimorph type having piezoelectric elements joined on either side of a base and those of the unimorph type having a piezoelectric element joined on one side of a base.

Generally, the bimorph piezoelectric vibrator has advantages such as a high vibration drive power and large vibration amplitudes compared with the unimorph piezoelectric vibrator.

FIG. 13 is an exploded perspective view of a piezoelectric actuator 101 having a bimorph piezoelectric vibrator. As shown in the figure, the piezoelectric actuator 101 has a pair of upper and lower piezoelectric elements 11 having a piezoelectric ceramic plate as an piezoelectric body, a base 12 to which the pair of upper and lower piezoelectric elements 11 are joined, an annular vibrating membrane 13 of which the inner peripheral part of the top surface is joined to the outer peripheral part of the undersurface of the base 12, and an annular support member (frame) 15 connecting and supporting the vibrating membrane 13. The pair of upper and lower piezoelectric elements 11 and base 12 constitute a piezoelectric vibrator (vibration generator) 10. A pair of electrode layers (not shown) as a conductor is formed on the top surface 11a and undersurface 11b of each piezoelectric element 11.

If the piezoelectric actuator 101 has a diameter (the length on a side) of 20 mm so that it can be used as an electronic part of a cell-phone, the piezoelectric actuator 101 has a fundamental resonance frequency $f_0$ of 2 kHz or higher.

FIG. 14(A) is a cross-sectional view of the core part of the piezoelectric actuator 101 having the above-described bimorph piezoelectric vibrator and FIG. 14(B) is a schematic illustration showing the vibration of the piezoelectric actuator 101.

As shown in FIGS. 14(A) and 14(B), as an alternating-current voltage is applied to the pair of upper and lower electrode layers of the piezoelectric element 11 to generate an alternating-current electric field within it, the piezoelectric element 11 radially expands/contracts. Since the piezoelectric element 11 is joined to the base 12 so as to restrain its expanding/contracting motions, as shown in FIG. 14(B), the base 12 flexes in the direction perpendicular to the joint surface to the piezoelectric element 11 as the piezoelectric element 11 expands/contracts. In other words, the base 12 repeatedly deforms into the convex mode indicated by the solid lines and into the concave mode indicated by the broken lines in FIG. 14(B). Then, as the base 12 deforms in such a manner, the inner peripheral part of the vibrating membrane 13 vibrates in the up-and-down (vertical or perpendicular) direction. Then, as the inner peripheral part of the vibrating membrane 13 vibrates, the base 12 and vibrating membrane 13 flex (vibrate) in the direction perpendicular to the top surface and undersurface (which are also termed the main surfaces) of the base 12, during which the connection part to the support member 15 serves as the fixed end and the center part of the base 12 serves as the largest amplitude part.

Generally made of a highly rigid material such as ceramics (a piezoelectric ceramic plate), the piezoelectric element 11 tends to vibrate with small vibration amplitudes. Therefore, the above-described piezoelectric actuator 101 tends to have a low level of vibration amplitude and/or sound pressure compared with an electrodynamic actuator using an electromagnetic force acting between a permanent magnet and a coil as the vibration drive source. Here, the term "rigidity" refers to a property of an object that is determined by the Young's modulus E (Pa) and form factors such as thickness and shape.

FIGS. 15 and 16 show a piezoelectric actuator 102 of another modified embodiment that is different from the above-described modified embodiment, namely the piezoelectric actuator 101. The piezoelectric actuator 102 is of the bimorph type and has the same structure as the piezoelectric actuator 101 shown in FIGS. 13, 14(A), and 14(B) except that the vibrating membrane 13 is clamped by a pair of upper and lower support members 15m and 15n.

When an actuator such as a piezoelectric actuator and electrodynamic actuator is used as a vibration device, it is desirable that the actuator vibrates with large vibration amplitudes in a specific frequency band. On the other hand, when an actuator is used as an acoustic device, it is important to take into account the frequency property of the vibration amplitude of the actuator. In other words, an acoustic device requires not only a high level of sound pressure (vibration amplitude) but also an even (flat) frequency property (for example, 80 dB±10 dB) in a frequency band of 500 Hz to 10 kHz, which is the important audible range in terms of auditory sense in order to faithfully reproduce the sound from acoustic wave signals contained in electric signals supplied to the actuator.

On the other hand, Patent Literature 1 and 2 disclose techniques for augmenting the vibration amplitude of a piezoelectric actuator using a bimorph piezoelectric vibrator.

Patent Literature 1 discloses an embodiment in which the piezoelectric actuator is applied to a vibration device. FIG. 29 of Patent Literature 1 discloses a piezoelectric actuator in which a base to either side of which a piezoelectric element is joined is supported by a support member via a vibrating membrane. The vibration of the piezoelectric elements is restricted by the base and converted to flexing motion. Multiple beams are provided at the outer peripheral part of the base. The vibration of the base is transmitted to the beams and further transmitted from the beams to the vibrating membrane so that a larger magnitude of vibration is obtained.

On the other hand, Patent Literature 2 discloses an embodiment in which the piezoelectric actuator is applied to an acoustic device. This piezoelectric actuator comprises a casing, an annular support member curved between the inner and outer peripheral parts and of which the outer peripheral part is fixed to the inner surface of the casing, and a piezoelectric vibrator fixed to the inner peripheral part of the support member and constructed by joining a piezoelectric element and a vibrating plate. With the vibrating plate and casing being coupled via the curved support member, the piezoelectric vibrator vibrates both in the direction perpendicular to the plate surface of the vibrating plate and in the direction parallel to the plate surface of the vibrating plate.

PRIOR ART LITERATURE

Patent Literature

Patent Literature 1: International Publication No. 2007/083497; and
Patent Literature 2: Unexamined Japanese Patent Application Kokai Publication No. 2001-339791.

SUMMARY OF INVENTION

Problems to be Solved by the Invention

However, the above piezoelectric actuators have the fundamental resonance frequency $f_0$ increased to 2 kHz or higher as they are reduced in size. When they are applied to vibration devices, it is difficult to augment the vibration amplitude in a frequency band up to 2 kHz. Furthermore, the vibration amplitude is augmented in a specific frequency band around the fundamental resonance frequency $f_0$. Then, when the piezoelectric actuators are applied to acoustic devices, it is difficult to improve the vibration amplitude and flatten the frequency property of the vibration amplitude at the same time. Then, there is a strong demand for a piezoelectric actuator ensuring that the vibration amplitude is improved and the frequency property of the vibration amplitude is flattened regardless of its small size. In other words, there is a strong demand for a technique for achieving a fundamental resonance frequency $f_0$ as low as possible and more flattening the frequency property of the vibration amplitude in a small piezoelectric actuator. The above problems also occur to electrodynamic actuators driven in a different system from piezoelectric actuators.

As described above, there is a strong demand for an actuator allowing for a high degree of freedom in designing the vibration properties and a small size, and usable as a vibration device and as an acoustic device regardless of its drive system (piezoelectric or electrodynamic), and its production technique.

The present invention is invented in view of the above problems and an exemplary object of the present invention is to provide an actuator and piezoelectric actuator allowing for a high degree of freedom in designing the vibration properties and a small size, an electronic device in which the actuator or piezoelectric actuator is installed, and a method for attenuating vibration and converting the vibration direction.

DISCLOSURE OF INVENTION

Means for Solving the Problems

In order to achieve the above object, the piezoelectric actuator according to a first exemplary aspect of the present invention comprises:
a piezoelectric vibrator composed of a piezoelectric element and a base vibrated by the piezoelectric element;
a vibrating membrane joined to the outer peripheral part of a main surface of the base and vibrating in association with vibration of the piezoelectric vibrator;
a support member supporting the vibrating membrane; and
a vibration direction converter interposed between the vibrating membrane and support member and deforming to convert vibration of the vibrating membrane in the surface direction parallel to its main surfaces to vibration of the vibrating membrane in the direction nearly perpendicular to the surface direction.

The actuator according to a second exemplary aspect of the present invention comprises:
a vibration generator generating vibration upon input of drive signals;
a vibrating membrane joined to the vibration generator and vibrating in association with vibration of the vibration generator;
a support member supporting the vibrating membrane; and
a vibration direction converter interposed between the vibrating membrane and support member and deforming to convert vibration of the vibrating membrane in the surface direction parallel to its main surfaces to vibration of the vibrating membrane in the direction nearly perpendicular to the surface direction.

The electronic device according to a third exemplary aspect of the present invention has the above piezoelectric actuator or actuator installed as a vibration device.

The electronic device according to a fourth exemplary aspect of the present invention has the above piezoelectric actuator or actuator installed as an acoustic device.

In the vibration attenuation and vibration direction conversion method according to a fifth exemplary aspect of the present invention, a viscoelastic body is interposed between a vibrating membrane vibrating in association with vibration of a vibration generator and a support member supporting the vibrating membrane, and the viscoelastic body is deformed by vibration of the vibrating membrane so as to attenuate vibration transmitted from the support member to the vibrating membrane and convert vibration of the vibrating membrane in the surface direction parallel to its main surfaces to vibration of the vibrating membrane in the direction nearly perpendicular to the surface direction.

Efficacy of the Invention

The present invention can provide an actuator and piezoelectric actuator allowing for a high degree of freedom in designing the vibration properties and a small size, an electronic device in which the actuator or piezoelectric actuator is installed, and a method for attenuating the vibration and converting the vibration direction.

BEST MODE FOR CARRYING OUT THE INVENTION

Embodiments of the present invention will be described hereafter. The present invention is applicable to vibration devices and acoustic devices to be installed in electronic devices represented by small communication devices such as various cell-phones, PDAs (personal digital assistants), and small PCs (personal computers). In other words, the following embodiments are given for the purpose of explanation and do not confine the scope of the invention of the present application. Therefore, a person of ordinary skill in the field can embrace an embodiment in which some or all elements are replaced with equivalent elements and such an embodiment is considered to fall under the scope of the present invention.

Embodiment 1

Figure 1:
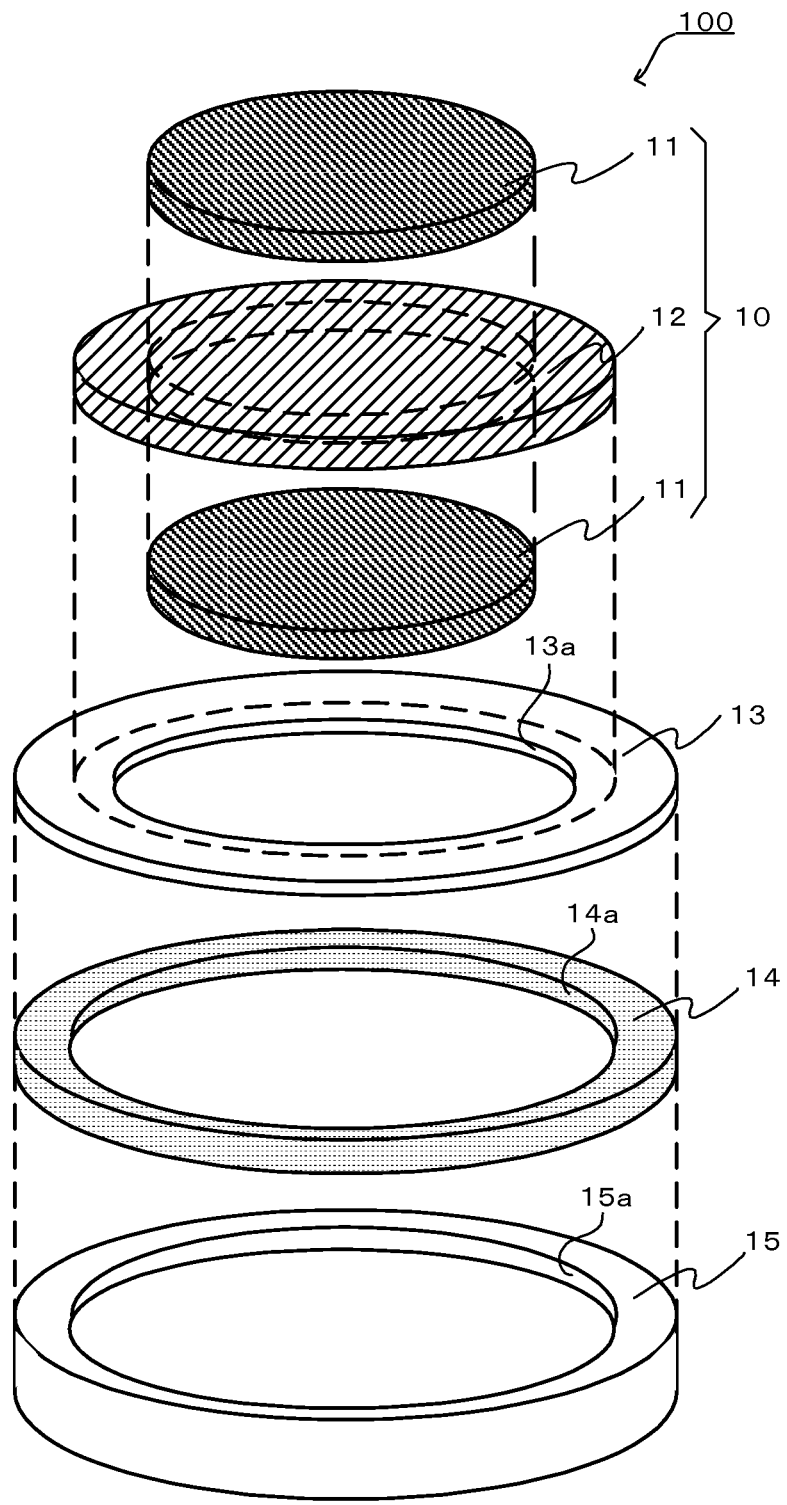
FIG. 1 is an exploded perspective view of the piezoelectric actuator according to Embodiment 1 of the present invention.

As shown in FIG. 1, a piezoelectric actuator 100 according to Embodiment 1 of the present invention comprises a disc-shaped piezoelectric vibrator 10, an annular vibrating membrane 13 joined to the outer peripheral edge part of the piezoelectric vibrator 10, a viscoelastic body 14 as a vibration direction converter in the form of a ring (circular frame) joined to the vibrating membrane 13, and an annular support member (frame) 15 supporting the vibrating membrane 13 via the viscoelastic body 14.

The vibrating membrane 13 is a film member for efficiently retrieving vibration from the piezoelectric vibrator 10. The viscoelastic body 14 exerts a function as a supporter supporting the vibrating membrane 13, a function of converting horizontal vibration of the vibrating membrane 13 to vertical vibration of the vibrating membrane 13 ("the vibration direction conversion function," hereafter), and a function of attenuating vibration transmitted from the support member 15 to the vibrating membrane 13 ("the vibration attenuation function," hereafter). The support member 15 has a function of stabilizing the entire shape of the piezoelectric actuator 100 and is used for joining (bonding) the piezoelectric actuator 100 to the casing of various communication devices (electronic devices) such as cell-phones. As shown in FIG. 1, the components of the piezoelectric actuator 100, namely the piezoelectric vibrator 10 consisting of piezoelectric elements 11 and a base 12 as described later, vibrating membrane 13, viscoelastic body 14, and support member 15, are stacked coaxially in the up-and-down (vertical or perpendicular) direction.

As shown in FIG. 2(A), the piezoelectric vibrator 10 is composed of a disc-shaped base 12 and a pair of disc-shaped (circular in a plane view) piezoelectric elements 11 having a diameter small than the base 12 and joined to the top surface and undersurface (main surfaces) of the base 12. The base 12 functions as a restricting member restricting the expanding/contracting motions of the piezoelectric elements 11 and converting the expanding/contracting motions of the piezoelectric elements 11 to vertical flexing motion of the base 12.

As shown in FIGS. 1 and 2(A), the outer peripheral part of the undersurface of the base 12 is joined around the circumference of an opening 13a at the center of the vibrating membrane 13. In other words, the base 12 is smaller in diameter than the circumference of the vibrating membrane 13 and larger in diameter than the opening 13a. The outer rim of the base 12 is situated around the circumference of the opening 13a. On the other hand, the piezoelectric elements 11 are smaller in diameter than the opening 13a. The lower piezoelectric element 11 is situated inside the opening 13a in the state shown in FIG. 2(A).

One surface of the viscoelastic body 14 is joined to the outer peripheral part of a main surface (the surface facing the viscoelastic body 14, or the undersurface in FIG. 2(A)) of the vibrating membrane 13 and the other surface is joined to the support member 15. In other words, the viscoelastic body 14 is interposed between and fixed to the vibrating membrane 13 and support member 15. Here, in the piezoelectric actuator 100 shown in FIG. 2(A), the opening 14a and circumference of the viscoelastic body 14 and the opening 15a and circumference of the support member 15 are circular and have the same diameter, respectively.

It is preferable that the area of the region in which the base 12 and vibrating membrane 13 are joined is half the area of the base 12 or smaller in FIG. 2(A). If the area exceeds half the area of the base 12, the joint part between the base 12 and vibrating membrane 13 may become highly rigid, then restricting the vibration of the piezoelectric vibrator 10 and diminishing the vibration amplitude of the vibrating membrane 13.

Here, in this embodiment, as shown in FIGS. 1 and 2(A), the vibrating membrane 13, viscoelastic body 14, and support member 15 all have a rectangular vertical cross-section.

As shown in FIG. 2(B), the piezoelectric element 11 is mainly composed of a piezoelectric ceramic plate 21 made of a piezoelectric substance and having two main surfaces 11a and 11b facing each other in parallel. The piezoelectric ceramic plate 21 is polarized upward in the vertical direction (the thickness direction of the piezoelectric element 11) of FIGS. 1 and 2(A). A pair of upper and lower electrode layers (conductors) 21a and 21b is formed on the main surfaces 11a and 11b of the piezoelectric element 11.

As shown in FIGS. 2(A) and 2(B), the undersurface 11b (the lower electrode layer 21b) of the upper piezoelectric element 11 of the pair of upper and lower piezoelectric elements 11 is joined to the center part of the top surface of the base 12. The top surface 11a (the upper electrode layer 21a) of the lower piezoelectric element 11 is joined to the center part of the undersurface of the base 12.

As shown in FIG. 2(C), the piezoelectric actuator 100 vibrates in the vertical direction as a result of the expanding/contracting motions of the pair of upper and lower piezoelectric elements 11.

Figure 2:
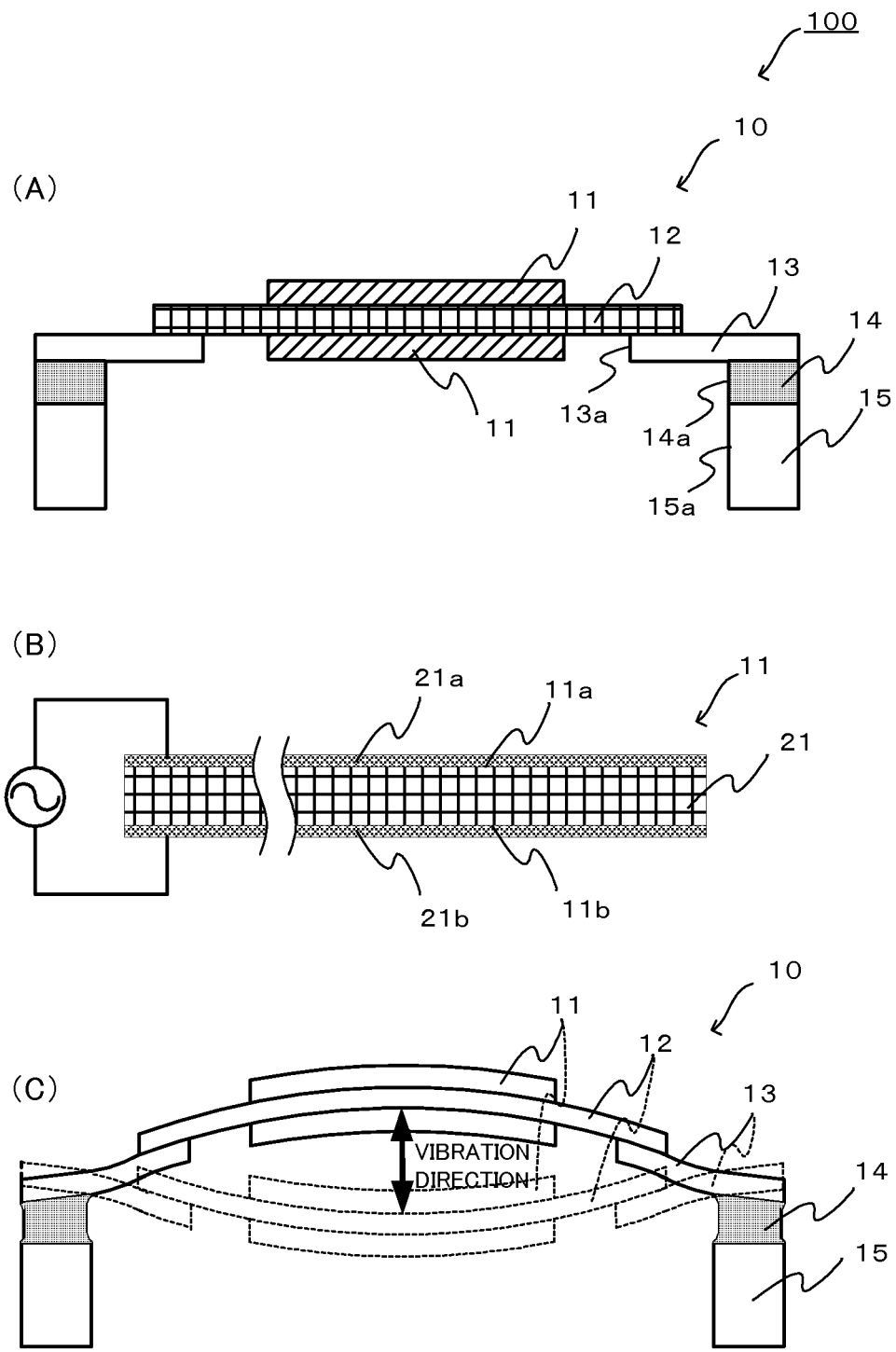
FIG. 2(A) is a cross-sectional view of the piezoelectric actuator according to Embodiment 1, (B) is an enlarged cross-sectional view of the piezoelectric element, and (C) is a schematic illustration showing the behavior (vibration) of the piezoelectric actuator shown in (A)

More specifically, an alternating-current voltage is applied to the upper and lower electrode layers 21a and 21b of the piezoelectric elements 11 (see FIG. 2 (B)) and an alternating-current electric field is generated through the piezoelectric ceramic plate 21. Then, the top surface 11a and undersurface 11b of the piezoelectric elements 11 radially expand/contract, resulting in the expanding/contracting motions of the piezoelectric elements 11. In other words, the piezoelectric elements 11 are placed in the expanding/contracting motions consisting of an alternate series of a first deformation mode in which the top surface 11a and undersurface 11b radially expand and a second deformation mode in which the top surface 11a and undersurface 11b radially contract.

Figure 14:
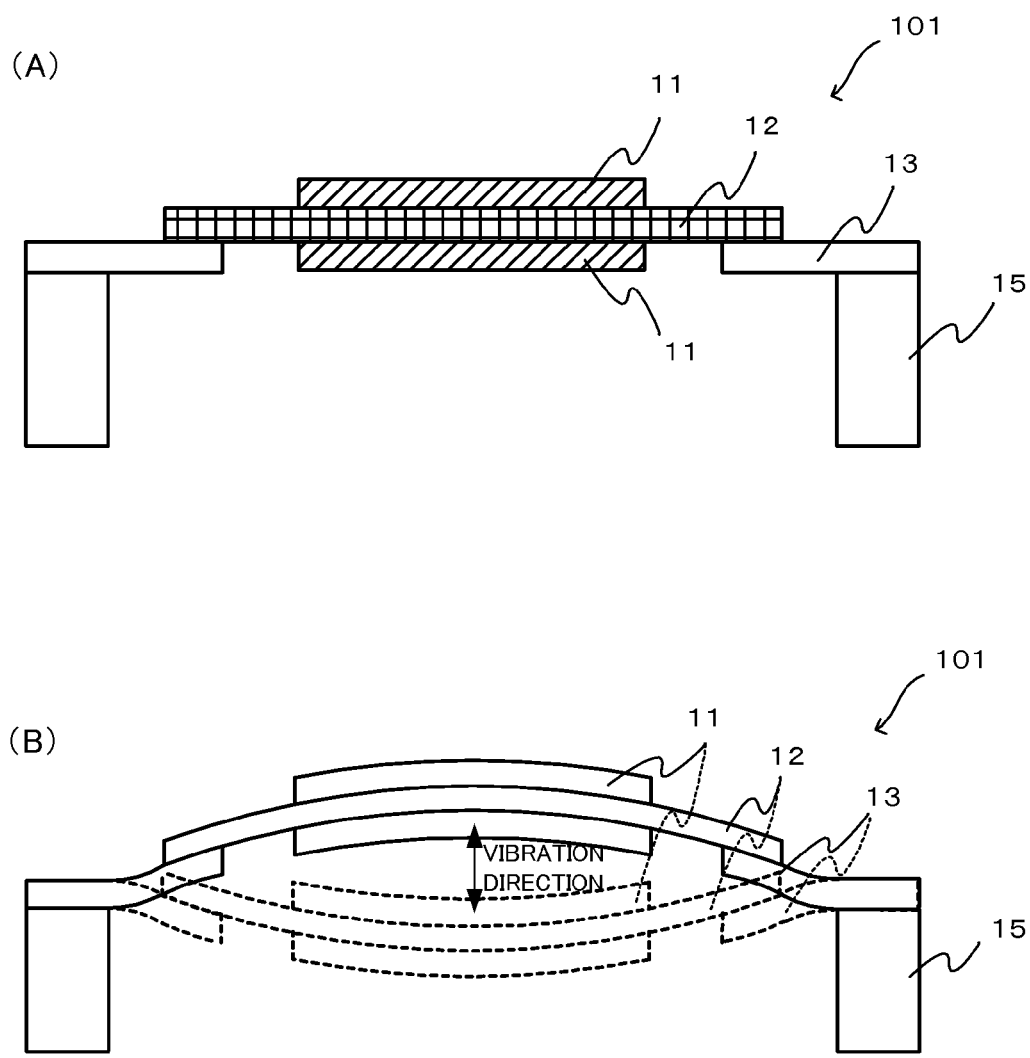
FIG. 14(A) is a cross-sectional view of the piezoelectric actuator shown in FIG. 13 and (B) is a schematic illustration showing the behavior (vibration) of the piezoelectric actuator shown in FIG. 13.

As described above, when the piezoelectric elements 11 expand/contract, difference in the deformation magnitude between the piezoelectric elements 11 (piezoelectric ceramic plates 21) and base 12 causes the base 12 to bend (flex) in the vertical direction. Then, the base 12 is repeatedly deformed into a convex mode indicated by the solid lines and into a concave mode indicated by the broken lines in FIG. 2(C) in accordance with the expanding/contracting motions of the piezoelectric elements 11. In this way, the piezoelectric vibrator 10 vibrates in the vertical direction. In other words, the base 12 and vibrating membrane 13 flex (vibrate) in the direction perpendicular to the top surface and undersurface (main surfaces) of the base 12, during which the joint part to the support member 15 via the viscoelastic body 14 serves as the fixed end and the center part of the base 12 serves as the largest amplitude part. As described above, as an alternating-current voltage is applied to the upper and lower electrode layers 21a and 21b of each of the piezoelectric elements 11, the piezoelectric vibrator 10 vibrates in the direction perpendicular to the top surface and undersurface (main surfaces) of the vibrating membrane 13. Here, alternating-current voltages of the reversed phases are applied to the upper and lower electrode layers 21a and 21b of the upper and lower piezoelectric elements 11. Then, the upper and lower piezoelectric elements 11 expand/contract in the opposite directions, whereby the amplitude of the flexing base 12 is further augmented. In other words, the upper piezoelectric element 11 is placed in the second deformation mode while the lower piezoelectric element 11 is in the first deformation mode and the upper piezoelectric element 11 is placed in the first deformation mode while the lower piezoelectric element 11 is in the second deformation mode, whereby the amplitude of the flexing base 12 can be augmented. Furthermore, the outer peripheral part of the undersurface of the vibrating membrane 13 is joined to the top surface of the elastically deformable viscoelastic body 14 and the inner peripheral part of the top surface of the vibrating membrane 13 is joined to the outer peripheral part of the undersurface of the base 12. Then, unlike the prior art vibrating membrane 13 that vibrates only in the inner peripheral part as shown in FIG. 14(B), not only the inner peripheral part but also the outer peripheral part of the vibrating membrane 13 vibrates in accordance with the elastic deformation of the viscoelastic body 14 while the base 12 vibrates. Having the above structure, the piezoelectric vibrator 10 can have the vibration amplitude (sound pressure level) augmented.

It is preferable that the piezoelectric element 11 has a thickness between 20 μm and 200 μm in order to achieve excellent flexing motion. In order for the undersurface 11b of the upper piezoelectric element 11 and the top surface 11a of the lower piezoelectric element 11 to entirely be joined to the base 12, the top surface 11a and undersurface 11b of the piezoelectric elements 11 have an area smaller than the surfaces of the base 12 facing the piezoelectric elements 11. Having such a structure, the base 12 effectively functions as a restricting member restricting the expanding/contracting motions of the piezoelectric elements 11 and converting the expanding/contracting motions of the piezoelectric elements 11 to the vertical flexing motion of the base 12.

Lead zirconate titanate (PZT) ceramics and barium titanate ceramics can favorably be used for the piezoelectric ceramic plate 21. Among them, PTZ ceramics are preferable because they provide high energy conversion efficiency in converting input power to vibration energy.

The base 12 can have various shapes providing proper elasticity, including circular, rectangular, and polygonal shapes in a plane view. Preferably, the base 12 is circular from the viewpoint of efficiently converting the vibration energy of the piezoelectric elements 11 to the flexing motion. Furthermore, the base 12 preferably has a thickness between 20 μm and 500 μm from the viewpoint of ensuring proper rigidity.

Materials usable for the base 12 include various metal materials such as phosphor bronze, 42 alloy, aluminum alloy, copper alloy, iron, iron alloy, titanium, titanium alloy, nickel, nickel alloy. Among them, use of phosphor bronze or 42 alloy is preferable because of their excellent strength and elasticity. Other materials usable for the base 12 include various resin materials such as epoxy, acrylic, polyimide, polycarbonate, polyethylene, polyethylene terephthalate, and urethane resins.

The vibrating membrane 13 can have various outer shapes such as circular, rectangular, and polygonal shapes. Like the base 12, the vibrating membrane 13 preferably has a circular outer shape from the viewpoint of efficiently converting the vibration energy of the piezoelectric elements 11 to the flexing motion. Furthermore, the vibrating membrane 13 preferably has a thickness between 5 μm and 500 μm, and more preferably a thickness between 15 μm and 180 μm from the viewpoint of yielding large vertical vibration amplitudes.

Materials usable for the vibrating membrane 13 include various resin materials such as epoxy, acrylic, polyimide, polycarbonate, polyethylene, polyethylene terephthalate, and urethane resins. Other materials usable for the vibrating membrane 13 include various metal materials such as aluminum alloy, copper alloy, iron, iron alloy, titanium, titanium alloy, nickel, and nickel alloy.

Rigidity D used as a property of the materials in this embodiment will be discussed in detail hereafter with reference to FIGS. 3(A) to 3(C).

Figure 3:
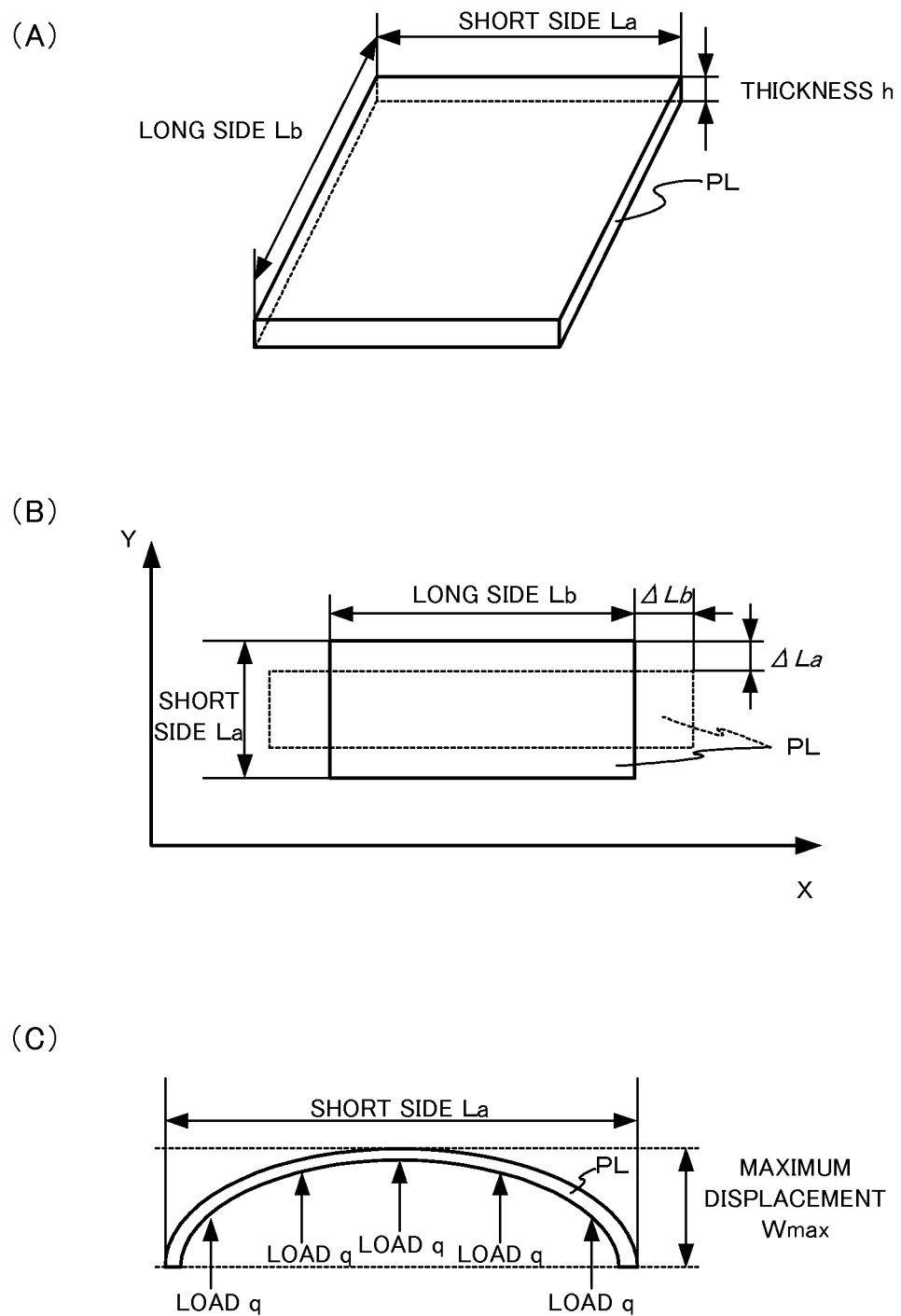
FIG. 3(A) is a perspective view showing a material specimen, (B) is a schematic illustration showing a method of obtaining the Poisson ratio in material deformation from the displacement magnitudes in the vertical (Y) and horizontal (X) directions of the specimen, and (C) is a schematic illustration showing the flexion deformation along the long side when a load q is applied to the specimen.

The rigidity D of a rectangular specimen PL shown in FIG. 3(A) is determined by material constants (E, ν) and the structure (dimensions), and presented by Formula 1 below.

$$\text{Rigidity } D = E \times h^3 / \{12 \times (1 - \nu^2)\} \quad \text{(Formula 1)}$$

in which E is the Young's modulus of the material, h is the thickness of the material, and ν is the Poisson ratio (expansion [contraction] rate of the specimen PL or the material in the Y direction/expansion [contraction] rate of the specimen PL in the X direction).

The Poisson ratio ν is a value of "expansion [contraction] rate of the specimen PL in the Y direction)/(expansion [contraction] rate of the specimen PL in the X direction" when a tension is applied to the specimen PL in the X direction, and presented by Formula 2 below.

$$\text{Poisson ratio } \nu = (\Delta La/La)/(\Delta Lb/Lb) \quad \text{(Formula 2)}$$

in which La is the length of a short side and Lb is the length of a long side.

For example, if the specimen PL is elongated by 1% in the X direction and, then, the specimen PL contracts by 0.3% in the Y direction, the Poisson ratio ν=0.3%/1%=0.3.

With reference to FIG. 3(C), the relationship between the maximum displacement $W_{max}$ and rigidity D when a load q is applied to the specimen PL to flex it along the short sides is presented by Formula 3 below.

$$\text{Maximum displacement } W_{max} \propto q \cdot La^4 / D \quad \text{(Formula 3)}$$

in which ∝ is the symbol for proportionality and q is the load.

A material undergoing proper loss due to internal friction, having low rigidity D, and having a low modulus of elasticity in tension, namely a low Young's modulus E (N/m²) is favorably used for the viscoelastic body 14.

In other words, the viscoelastic body 14 preferably has a Young's modulus E between $1 \times 10^4$ (N/m²) and $1 \times 10^{11}$ (N/m²), and more preferably a Young's modulus E between $1 \times 10^6$ (N/m²) and $1 \times 10^8$ (N/m²). Furthermore, if the viscoelastic body 14 is made of elastomer (a rubber material), the viscoelastic body 14 preferably has a hardness (JIS K 6253) between 20 and 80, more preferably a hardness between 30 and 70. Having the Young's modulus E or hardness within the above ranges, the viscoelastic body 14 can achieve both the vibration direction conversion function and the vibration attenuation function. In other words, if the viscoelastic body 14 has a Young's modulus E equal to or lower than $1 \times 10^4$ (N/m²), the rigidity D becomes excessively low, whereby the vibration direction conversion function may be unfulfilled. If the viscoelastic body 14 has a Young's modulus E equal to or higher than $1 \times 10^{11}$ (N/m²), the rigidity D becomes excessively high, whereby the vibration attenuation function may be unfulfilled.

Materials usable for the viscoelastic body 14 include various kinds of elastomer (rubber elastic substances), various composite materials consisting of elastomer and other materials, various resin materials (polymers), and various metal materials.

More specifically, the material for the viscoelastic body 14 can be selected from elastomers consisting of rubber materials such as natural rubber, butyl rubber, silicon rubber, and nitrile rubber, and composite materials consisting of a rubber material in which fine carbon particles are dispersed as appropriate according to desired vibration properties of the piezoelectric actuator 100. Among them, use of silicon rubber is preferable because it is easy to process and has excellent heat resistance. By the way, silicon rubber has a nonlinear property allowing the function of attenuating abrupt change in the resonance property due to the material property and/or structure of an object (the vibrating membrane 13) ("the resonance property attenuation function") to be enhanced as the vibration amplitude of the object is augmented. Then, advantageously, silicon rubber also has the function of selectively attenuating vibration in a range around the fundamental resonance frequency $f_0$ of the piezoelectric vibrator 10 and preventing excessive vibration as described later (see FIG. 4(C)).

Various resin and metal materials can be used for the support member 15. Those having high rigidity D are preferable for maintaining the entire shape of the piezoelectric actuator 100.

Here, an ABS resin or polycarbonate resin, or a composite resin material with glass fiber can be used for the support member 15. Metal materials usable for the support member 15 include aluminum, aluminum alloy, magnesium alloy, copper alloy, iron, iron alloy, titanium, titanium alloy, nickel, and nickel alloy.

It is preferable that the vibrating membrane 13 has the rigidity D higher than the viscoelastic body 14 and lower than the base 12. In other words, it is preferable that the viscoelastic body 14 has the rigidity D lower than the vibrating membrane 13 and support member 15. Here, using different materials to form the base 12, vibrating membrane 13, and viscoelastic body 14, their rigidity D can be adjusted. Alternatively, modifying the base 12, vibrating membrane 13, and viscoelastic body 14 in thickness and/or shape, their rigidity D can be adjusted as well.

In this embodiment, the best combination of materials for the base 12, vibrating membrane 13, and viscoelastic body 14 is, for example, phosphor bronze for the base 12, PET (polyethylene terephthalate) resin for the vibrating membrane 13, and silicon rubber having a hardness (JIS K 6253) of 60 or lower for the viscoelastic body 14.

In this embodiment, for example, an epoxy adhesive suitable for bonding different materials can be used to bond the components constituting the piezoelectric actuator 100. Here, the thickness of thin adhesive layers formed between the components is preferably 20 μm or smaller. If the thickness exceeds 20 μm, the adhesive layers will absorb an excessive quantity of vibration energy, which may cause the piezoelectric actuator 100 (the vibrating membrane 13) to have a vibration amplitude lower than a desired value.

Here, a forced oscillation attenuation model will be discussed with reference to FIGS. 4(A) to 4(C) for quantitative review on vibration attenuation in the resonant oscillation range of an object (which corresponds to the vibrating membrane 13 in this embodiment).

Figure 4:
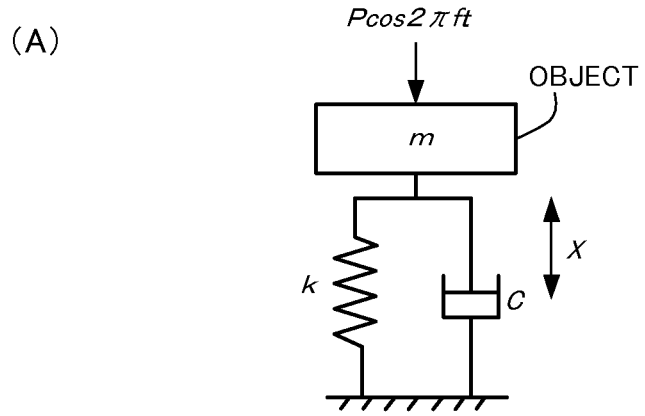
FIG. 4(A) is a schematic illustration showing a forced oscillation model of a viscous attenuation system with the degree of freedom of 1, (B) is a graphical representation showing a resonance curve of forced oscillation, and (C) is a graphical representation for explaining attenuation of the vibration amplitude in the viscoelastic body model.
Figure 4:
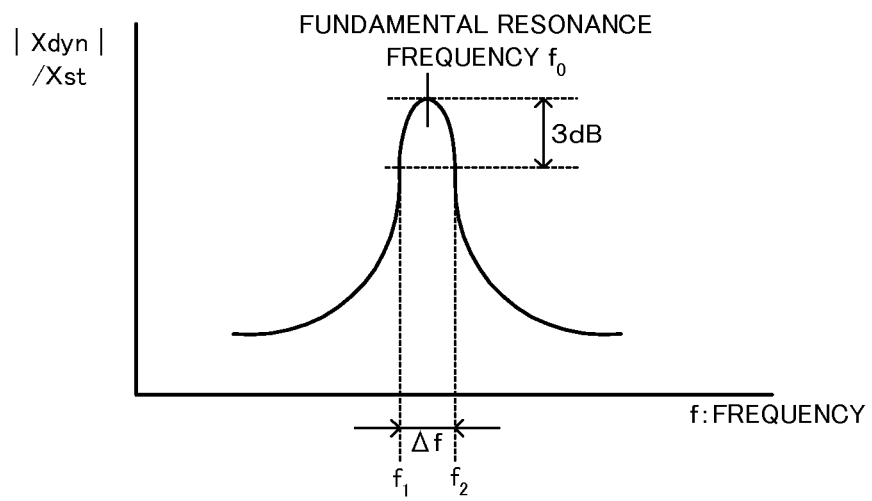
Figure 4:
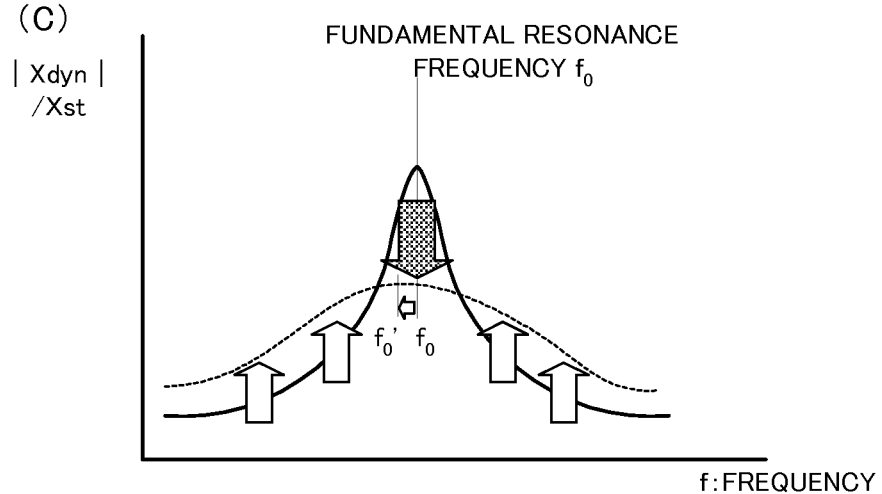

As shown in FIG. 4(A), when a force P cos(2πf·t) (f is a frequency) is applied to an object (a mass m) supported by a fixed member via a viscoelastic model (which corresponds to the viscoelastic body 14 in this embodiment) created by parallel-connecting a spring having a spring constant k and a dashpot having a viscous damping coefficient c, the object is subject to forced oscillation accompanied by viscous attenuation.

Here, the parameter |Xdyn|/Xst presenting the oscillation amplitude of the resonating object is approximated by Formula 4 below in which ζ is the damping ratio of the viscoelastic model and the Q value is the amplitude multiplying factor (oscillation gain) of the resonating object.

$$|Xdyn|/Xst = 1/2\zeta = Q \text{ value} (=\sqrt{m}/c) \tag{Formula 4}$$

in which Xst is the static displacement (F=k·Xst) (F is the spring tension force and k is the spring constant), Xdyn is the dynamic displacement, the damping ratio ζ<1, and c is the viscous damping coefficient.

Hence, it can be said that |Xdyn|/Xst is proportional to the Q value and inversely proportional to the damping ratio ζ and viscous damping coefficient c.

As seen from the above, the Q value is the ratio between the static displacement Xst determined based on the Hooke's law (F=k·Xst) and the dynamic displacement Xdyn at the resonance frequency, and used as a quantity presenting the sharpness of resonance. The Q value can be obtained by calculating the frequency band $\Delta f (=f_2-f_1)$ between the points of −3 dB from the maximum amplitude on the resonance curve shown in FIG. 4(B) and calculating the ratio between $\Delta f$ and the fundamental resonance frequency $f_0$ using Formula 5 below.

$$Q \text{ value} = f_0/\Delta f = f_0/(f_2-f_1) \tag{Formula 5}$$

in which $f_0 = 1/(2\pi) \times \sqrt{(k/m)}$, $f_2$ and $f_1$ are the frequencies corresponding to the points of −3 dB from the maximum amplitude on the resonance curve ($f_2 > f_1$).

From the above Formula 4, it is understood that the damping ratio ζ and Q value have an inversely proportional relationship. As the damping ratio ζ of the viscoelastic model is increased, namely as the object resonance property attenuation function of the viscoelastic model is enhanced, the Q value lowers. Furthermore, as the spring constant k of the viscoelastic model is diminished, the fundamental resonance frequency $f_0$ lowers (the fundamental resonance frequency $f_0$ shifts from $f_0$ to $f_0'$ in the case shown in FIG. 4(C)).

In other words, as shown in FIG. 4(C), when the resonance property attenuation function (damping ratio ζ) of the viscoelastic model is enhanced (the Q value lowers) and the spring contact k of the viscoelastic model is diminished, the fundamental resonance frequency $f_0$ lowers and the resonance curve of forced oscillation (the frequency property of sound pressure level (vibration amplitude)) is flattened (broadened). More specifically, excessive oscillation around the fundamental resonance frequency $f_0$ is prevented and the oscillation amplitude of an object at the other frequencies is augmented. Such effect does not appear when only the Q value is lowered. It appears only when the vibrating membrane 13 to which the piezoelectric vibrator 10 is joined to via the viscoelastic body 14 having low rigidity D is supported by the support member 15.

In order to enhance the object resonance property attenuation function (damping ratio ζ) of the viscoelastic model, it is desirable that the viscoelastic body 14 as the above viscoelastic model is made of a material having low rigidity D and a low modulus of elasticity in tension, namely a low Young's modulus E (N/m²). In other words, the viscoelastic body 14 preferably has a Young's modulus E between $1 \times 10^4$ (N/m²) and $1 \times 10^{11}$ (N/m²), and more preferably a Young's modulus E between $1 \times 10^6$ (N/m²) and $1 \times 10^8$ (N/m²). Furthermore, when the viscoelastic body 14 is made of elastomer (a rubber material), the viscoelastic body 14 preferably has a hardness (JIS K 6253) between 20 and 80 and more preferably a hardness between 30 and 70. Using the above materials represented by silicon rubber and having the Young's modulus E and hardness in the above ranges, the viscoelastic body 14 will be enhanced in the resonance property attenuation function.

When the vibration amplitude (mechanical distortion) of an object is small, the vibration prevention effect of the viscoelastic body 14 is low. On the other hand, when the vibration amplitude of an object is large, the vibration attenuation function of the viscoelastic body 14 is prominent. Then, as the vibration attenuation function of the viscoelastic body 14 is improved, abrupt change in the resonance property of an object is prevented, while the viscoelastic body 14 tends to deteriorate in the vibration direction conversion function.

Behavior of the piezoelectric actuator 100 of this embodiment will be described hereafter with reference to FIGS. 5(A) and 5(B).

Figure 13:
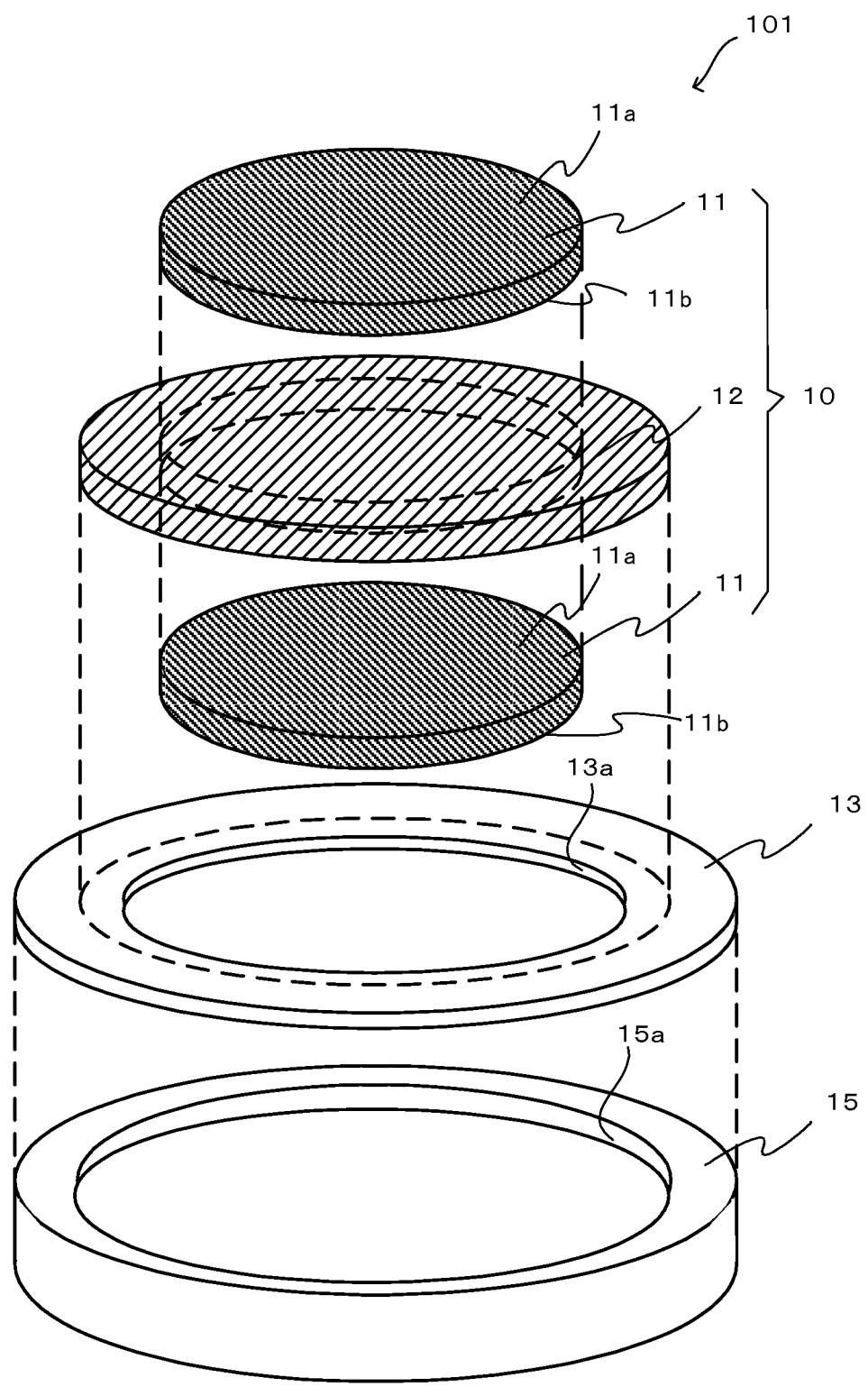
FIG. 13 is an exploded perspective view of the piezoelectric actuator according to a modified embodiment.

In the piezoelectric actuator 101 of a modified embodiment shown in FIGS. 13, 14(A), and 14(B), the vibrating membrane 13 and support member 15 are directly joined. Therefore, only part of the vibration of the vibrating membrane 13 in the horizontal surface (transversal) direction is converted to the vibration of the vibrating membrane 13 in the up-and-down (vertical or perpendicular) direction. Furthermore, the horizontal (transversal) stress concentrates around the joint part between the vibrating membrane 13 and more rigid support member 15.

On the other hand, in the piezoelectric actuator 100 of this embodiment, as shown in FIG. 2(A), the vibrating membrane 13 is coupled to the support member 15 via the viscoelastic body 14 having the rigidity D lower than the vibrating membrane 13.

Figure 5:
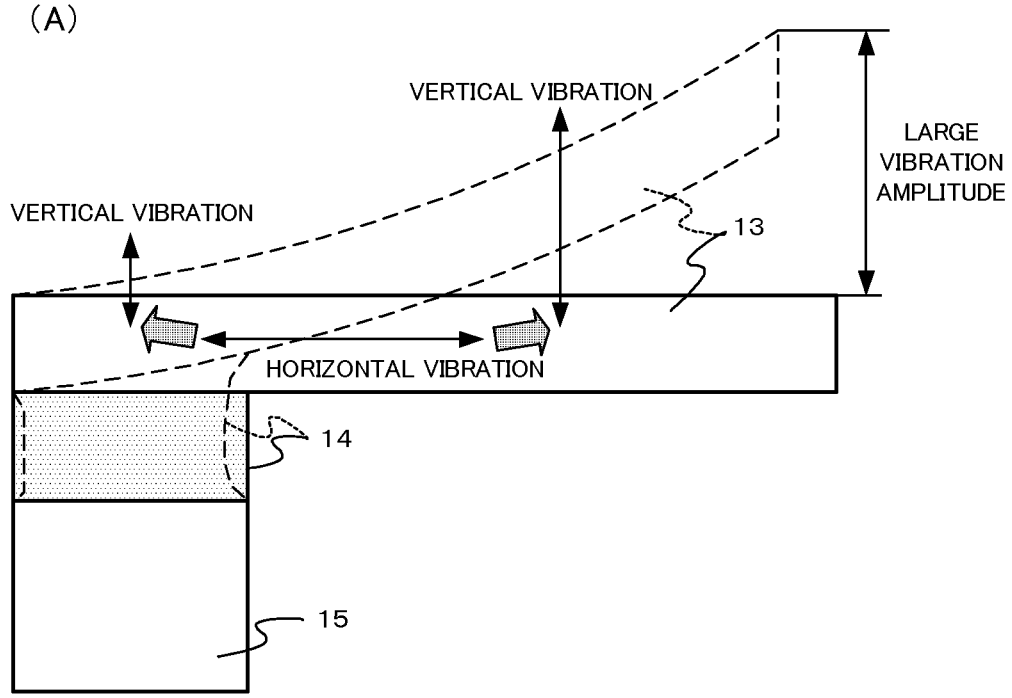
FIG. 5(A) is an enlarged schematic illustration for explaining the behavior of the piezoelectric actuator according to Embodiment 1 of the present invention and (B) is an enlarged schematic illustration for explaining the behavior of the piezoelectric actuator according to a modified embodiment.
Figure 5:
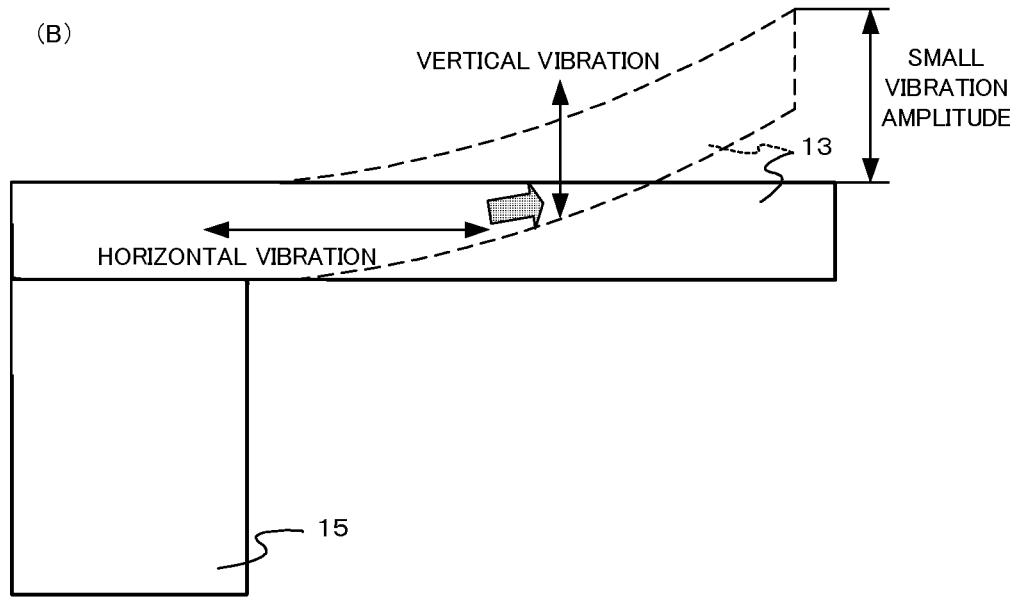

As shown in FIGS. 4(C) and 5(A), the vibrating membrane 13 supported by the deformable viscoelastic body (silicon rubber) 14 yields the following effects (1) and (1).

(1) The vibration of the vibrating membrane 13 in the surface direction (horizontal direction) parallel to the membrane surfaces (main surfaces) that is transmitted from the piezoelectric vibrator 10 is highly efficiently converted to the vibration in the up-and-down (vertical) direction nearly perpendicular thereto. This vibration causes the vibrating membrane 13 and viscoelastic body 14 to flex, whereby the vibrating membrane 13 largely vibrates in the vertical direction. Furthermore, since the viscoelastic body 14 is less rigid than the vibrating membrane 13, the horizontal vibration of the vibrating membrane 13 is converted to the vertical vibration with higher efficiency. The viscoelastic body 14 interposed between the vibrating membrane 13 and support member 15 prevents local concentration of the horizontal (transversal) stress.

(2) The resonance curve of forced oscillation (the frequency property of sound pressure level (vibration amplitude)) is flattened (broadened). In other words, excessive vibration around the fundamental resonance frequency $f_0$ is prevented and the vibration amplitude of an object at the other frequencies is augmented.

In the piezoelectric actuator 101 of a modified embodiment in which the support member 15 and vibrating membrane 13 are directly joined, the outer peripheral part of the vibrating membrane 13 is restrained by the support member 15 having high rigidity D and does not contribute to the vibration of the piezoelectric actuator 101 at all. Conversely, in the piezoelectric actuator 100 of this embodiment, the vibrating membrane 13 is supported by the support member 15 via the viscoelastic body 14 made of a material having low rigidity D. Therefore, the outer peripheral part of the vibrating membrane 13 can afford a large vibration amplitude. Consequently, the vertical vibration amplitude of the piezoelectric vibrator 10 is apparently augmented, whereby the vibration amplitude of the piezoelectric actuator 100 (the vibrating membrane 13) is improved and the fundamental resonance frequency $f_0$ lowers from 2 kHz to near 1 kHz. Then, the frequency property of the vibration amplitude of the piezoelectric actuator 100 is flattened in a frequency band of 500 Hz to 10 kHz (80 dB±10 dB).

Furthermore, the viscoelastic body 14 is made of a material having low rigidity D and prominent in the vibration attenuation function particularly in the range in which the vibrating membrane 13 has large vibration amplitudes, whereby the viscoelastic body 14 is prominent in the resonance property attenuation function. Then, the piezoelectric actuator 100 effectively achieves both augmentation of the vibration amplitude in a low frequency band and the above-described flattening of the frequency property of the vibration amplitude. Furthermore, the complex support structure consisting of the low rigidity viscoelastic body 14 and high rigidity support member (frame) 15 allows the viscoelastic body 14 to exert the function of attenuating the vibration transmitted from the support member 15 to the vibrating membrane 13. Furthermore, this structure serves to prevent the vibration of the casing of an electronic device to which the support member 15 is secured from being transmitted to the piezoelectric vibrator 10 that is the vibration source.

The piezoelectric actuator 100 of this embodiment has the following effects.

The piezoelectric actuator 100 can be down-sized and flattened because of its basic structure, and provide vibration amplitudes sufficiently large in a broad frequency band of 500 Hz to 10 kHz. Then, the piezoelectric actuator 100 can favorably be installed as a vibration device or acoustic device in small electronic devices, such as cell-phones, having a limited space for electronic parts used to occupy.

Since the fundamental resonance frequency $f_0$ of the piezoelectric actuator 100 is set to around 1 kHz, the sound waves in an audible frequency band of 500 Hz to 10 kHz can be reproduced with 80 dB to 10 dB. Then, the piezoelectric actuator 100 can favorably be used particularly as an acoustic device for reproducing music.

In considering the mechanical vibration property of the piezoelectric actuator 100, lowering the rigidity D of the viscoelastic body 14 means lowering the apparent rigidity of the piezoelectric actuator 100 and increasing the contribution of apparent mass components of the piezoelectric actuator 100 to the vibration property. In other words, three structural components determining the mechanical vibration property of the piezoelectric actuator 100, the rigidity D, mass m, and resonance property attenuation function, are taken into account in designing the vibration property so as to augment the vibration amplitude of the piezoelectric actuator 100 (the vibrating membrane 13) and flatten the frequency property of the vibration amplitude.

In the piezoelectric actuator 100, the base 12 is coupled to the support member 15 or the casing of an electronic device via the vibrating membrane 13 and viscoelastic body 14 having the rigidity D lower than the base 12. Therefore, if the support member 15 or the casing of an electronic device is subject to impact, the viscoelastic body 14 and vibrating membrane 13 absorb the impact before it is transmitted to the piezoelectric elements 11. Therefore, even if a brittle ceramic material is used as the piezoelectric body of the piezoelectric elements 11, the risk of the piezoelectric element 11 being damaged is reduced. Then, the piezoelectric actuator 100 can favorably be used in portable electronic devices that are likely to be subject to significant impact upon mishandling by the user such as drop.

As long as the support member 15 maintains its structure to support the vibrating membrane 13 via the viscoelastic body 14 having the rigidity D lower than the base 12 and vibrating membrane 13, the piezoelectric actuator 100 can augment the vibration amplitude and flatten the frequency property of the vibration amplitude of the vibrating membrane 13. It is preferable for a small actuator to have such properties. Furthermore, the vibration property of the piezoelectric actuator 100 can be designed with freedom. In other words, the piezoelectric actuator 100 can have diversified vibration properties by changing the base 12, vibrating membrane 13, and viscoelastic body 14 in material and/or shape on an arbitrary basis. Furthermore, the piezoelectric elements 11, base 12, vibrating membrane 13, and viscoelastic body 14 can be changed in shape and thickness without changing the size of the support member 15. Therefore, the piezoelectric actuator 100 can be a universal part of which the support member 15 can be attached to an electronic device of any size. For that reason, an electronic device in which the piezoelectric actuator 100 is installed as a vibration device or acoustic device can flexibly accommodate design change, whereby the production cost of the electronic device can be reduced.

Embodiment 2

Figure 6:
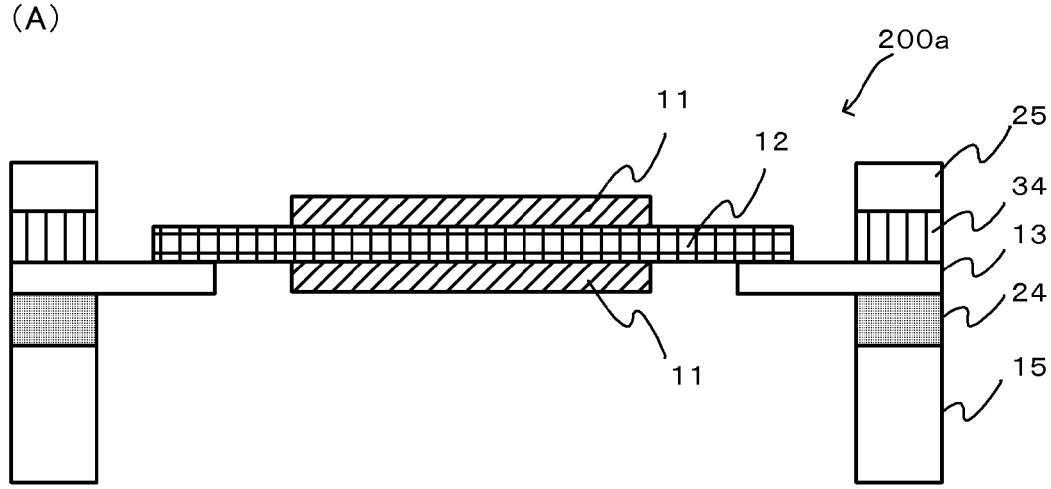
FIG. 6(A) is a cross-sectional view showing the piezoelectric actuator according to Embodiment 2 of the present invention and (B) is a cross-sectional view showing the piezoelectric actuator according to a modified embodiment thereof.
Figure 6:
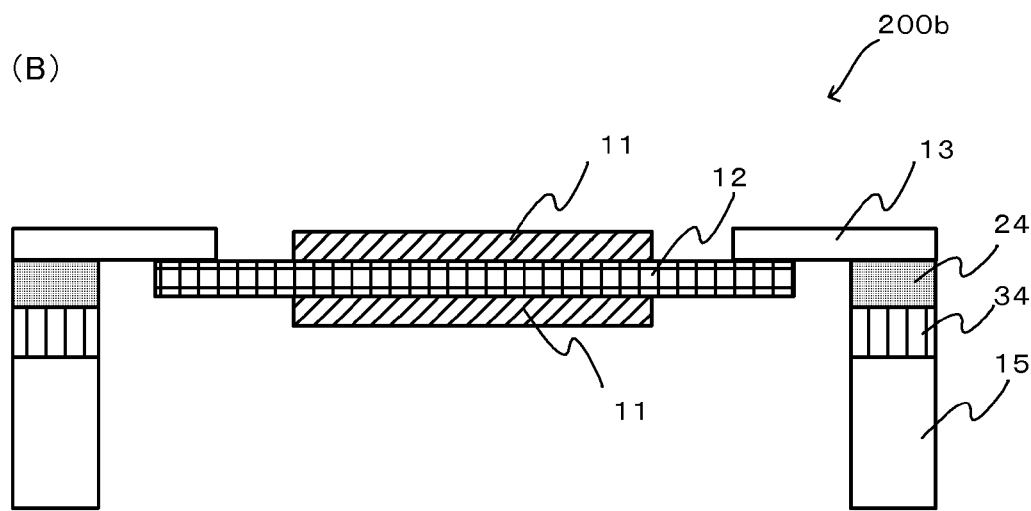

In the piezoelectric actuator 100 of Embodiment 1, the viscoelastic body 14 is joined only to the undersurface of the vibrating membrane 13. Conversely, in a piezoelectric actuator 200a of Embodiment 2, as shown in FIG. 6(A), first and second viscoelastic bodies 24 and 34 made of different materials are joined to the top surface and undersurface of the vibrating membrane 13, respectively.

In other words, in Embodiment 2, the vibrating membrane 13 is clamped by the first and second viscoelastic bodies 24 and 34 that are different in the rigidity D. Then, in FIG. 6(A), the undersurface of the first viscoelastic body 24 is secured to the support member 15 and the top surface of the second viscoelastic body 34 is secured to a support member 25 that is different from the support member 15. Here, the support member 25 is not used for coupling to the casing of an electronic device and has a free end. The piezoelectric actuator 200a is the same in the other structure as the piezoelectric actuator 100 of Embodiment 1. In the following explanation, the same components are referred to by the same or corresponding reference numbers and their explanation is omitted unless otherwise noted.

Both the first and second viscoelastic bodies 24 and 34 have the rigidity D lower than the vibrating membrane 13 and an annular shape, but they are made of different materials.

Like the viscoelastic body 14, a material having low rigidity D or Young's modulus E tends to be prominent in the resonance property attenuation function attenuating abrupt change in the resonance property due to internal mechanical loss of the material. Furthermore, the resonance property attenuation function tends to be prominent in a particular frequency band different depending on materials and intrinsic to an individual material and be moderate in any other frequency band.

With the first and second viscoelastic bodies 24 and 34 exerting the resonance property attenuation function in indifferent frequency bands being joined to the vibrating membrane 13 as shown in FIG. 6(A), the piezoelectric actuator 200a can attenuate the vibration of the piezoelectric actuator 100 in a frequency band broader than the piezoelectric actuator 100. Furthermore, the frequency property of the vibration amplitude of the piezoelectric actuator 200a (the vibrating membrane 13) is flattened. Consequently, compared with the piezoelectric actuator 100 of Embodiment 1, the piezoelectric actuator 200a is further favorable as an acoustic device.

FIG. 6(B) shows a piezoelectric actuator 200b according to a modified embodiment of Embodiment 2. In this modified embodiment, one surface (the top surface) of the first viscoelastic body 24 is joined to the outer peripheral part of the undersurface of the vibrating membrane 13, and the other surface (the undersurface) of the first viscoelastic body 24 is joined to the top surface of the second viscoelastic body 34. In other words, in this modified embodiment, the first and second viscoelastic bodies 24 and 34 that are different in rigidity compose a single viscoelastic body (vibration direction converter). Like the mode shown in FIG. 6(A) in which the first and second viscoelastic bodies 24 and 34 are joined to the top surface and undersurface of the vibrating membrane 13, this modified embodiment can augment the vibration amplitude of the vibrating membrane 13 and further flatten the frequency property of the vibration amplitude compared with the piezoelectric actuator 100.

Embodiment 3

Figure 7:
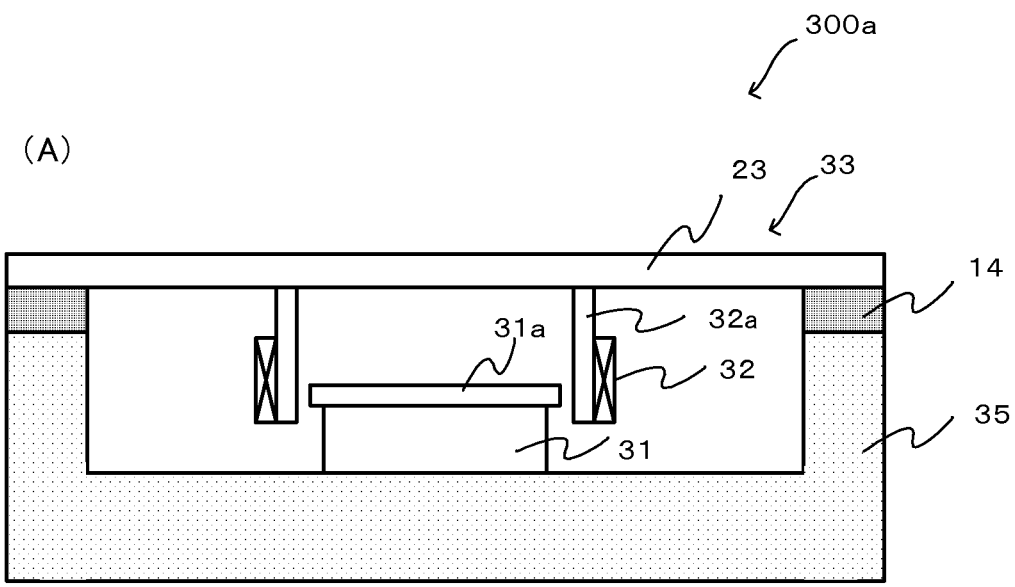
FIG. 7(A) is a cross-sectional view showing the piezoelectric actuator according to Embodiment 3 of the present invention and (B) is a cross-sectional view showing the piezoelectric actuator according to a modified embodiment.
Figure 7:
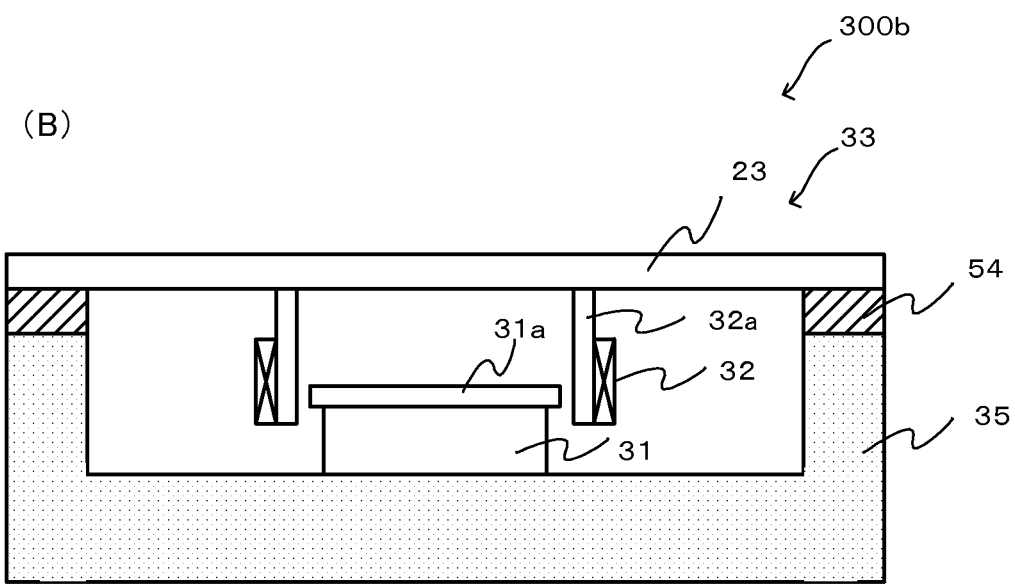

The technical idea of the present invention is applicable not only to the piezoelectric actuators 100, 200a, and 200b of Embodiments 1 and 2 but also to an electrodynamic actuator 300a using an electrodynamic converter (vibration generator) 33 consisting of a permanent magnet 31 and a coil 32 as shown in FIG. 7(A). The electrodynamic actuator 300a uses an electromagnetic force acting between the permanent magnet 31 and energized coil 32 as the vibration drive source.

As shown in FIG. 7(A), the electrodynamic actuator 300a comprises a yoke 35 as a support member in the form of a closed-end cylinder, a permanent magnet 31 provided at the center of the inner bottom of the yoke 35, a cylindrical member 32a surrounding the permanent magnet 31 and on the outer periphery of which a coil 32 is wound, and a vibrating membrane 23 at the center of the undersurface of which the cylindrical member 32a is joined.

The outer peripheral part of the undersurface of the vibrating membrane 23 is joined to the top surface of the viscoelastic body 14 having the rigidity D lower than vibrating membrane 23 and preventing transmission of detrimental or unnecessary vibration. The undersurface of the viscoelastic body 14 is joined to the top surface of the yoke 35, whereby the viscoelastic body 14 is supported by the yoke 35.

As an alternating-current voltage containing sound signals is applied to the coil 32 in the state shown in FIG. 7(A), an electromagnetic force acts between the permanent magnet 31 and energized coil 32, whereby the vibrating membrane 23 vibrates to reproduce the sound corresponding to the sound signals.

The vibrating membrane 23 is supported by the viscoelastic body 14 having the rigidity D lower than the vibrating membrane 23. Therefore, like the piezoelectric actuators 100, 200a, and 200b of Embodiments 1 and 2, the piezoelectric actuator 300a can augment the vibration amplitude of the vibrating membrane 23 and flatten the frequency property of the vibration amplitude by lowering the fundamental resonance frequency $f_0$ of the vibrating membrane 23.

The present invention is not confined to the above-described Embodiments 1 to 3 and various modifications and applications are available.

For example, the above-described Embodiments 1 and 2 utilize the piezoelectric ceramic plate 21 as the piezoelectric body. However, the piezoelectric body is not restricted to such a ceramic material. Polymer materials such as polyvinylidene-fluoride can be used as the piezoelectric body as long as the material expands/contracts in diameter as an alternating-current electric field occurs within it.

In the above-described Embodiments 1 and 2, the bimorph piezoelectric vibrator 10 in which the piezoelectric elements 11 are joined to both sides of the base 12 is used. However, the piezoelectric vibrator 10 is not restricted thereto and can be a unimorph piezoelectric vibrator in which the piezoelectric element 11 is joined to only one side of the base 12. The unimorph piezoelectric vibrator drives the vibrating membrane 13 to produce vibration with approximately half the efficiency of the bimorph piezoelectric element 10. However, it is preferable in acoustic device applications not requiring a high sound pressure level such as earphones from the viewpoint of reducing the production cost.

In the above-described Embodiments 1 and 2, the piezoelectric vibrator 10 includes a pair of upper and lower piezoelectric elements 11 having the same structure. In other words, the paired upper and lower piezoelectric elements 11 each have a pair of upper and lower electrode layers 21a and 21b formed on the top surface 11a and undersurface 11b of a piezoelectric ceramic plate 21. However, the upper and lower piezoelectric elements 11 are not restricted thereto and can have different structures. For example, one of the upper and lower piezoelectric elements 11 has an electrode layer only on one of the top surface 11a and undersurface 11b of a piezoelectric ceramic plate 21 and the other has a pair of upper and lower electrode layers on both the top surface 11a and undersurface 11b of a piezoelectric ceramic plate 21.

In the above-described Embodiments 1 and 2, the piezoelectric vibrator 10 has the base 12 joined to the vibrating membrane 13. The piezoelectric vibrator 10 can have the piezoelectric elements 11 joined to the vibrating membrane 13. Furthermore, in the above-described Embodiments 1 and 2, a single (one) piezoelectric vibrator 10 is joined to the vibrating membrane 13. Multiple piezoelectric vibrators 10 can be joined to the vibrating membrane 13.

Figure 8:
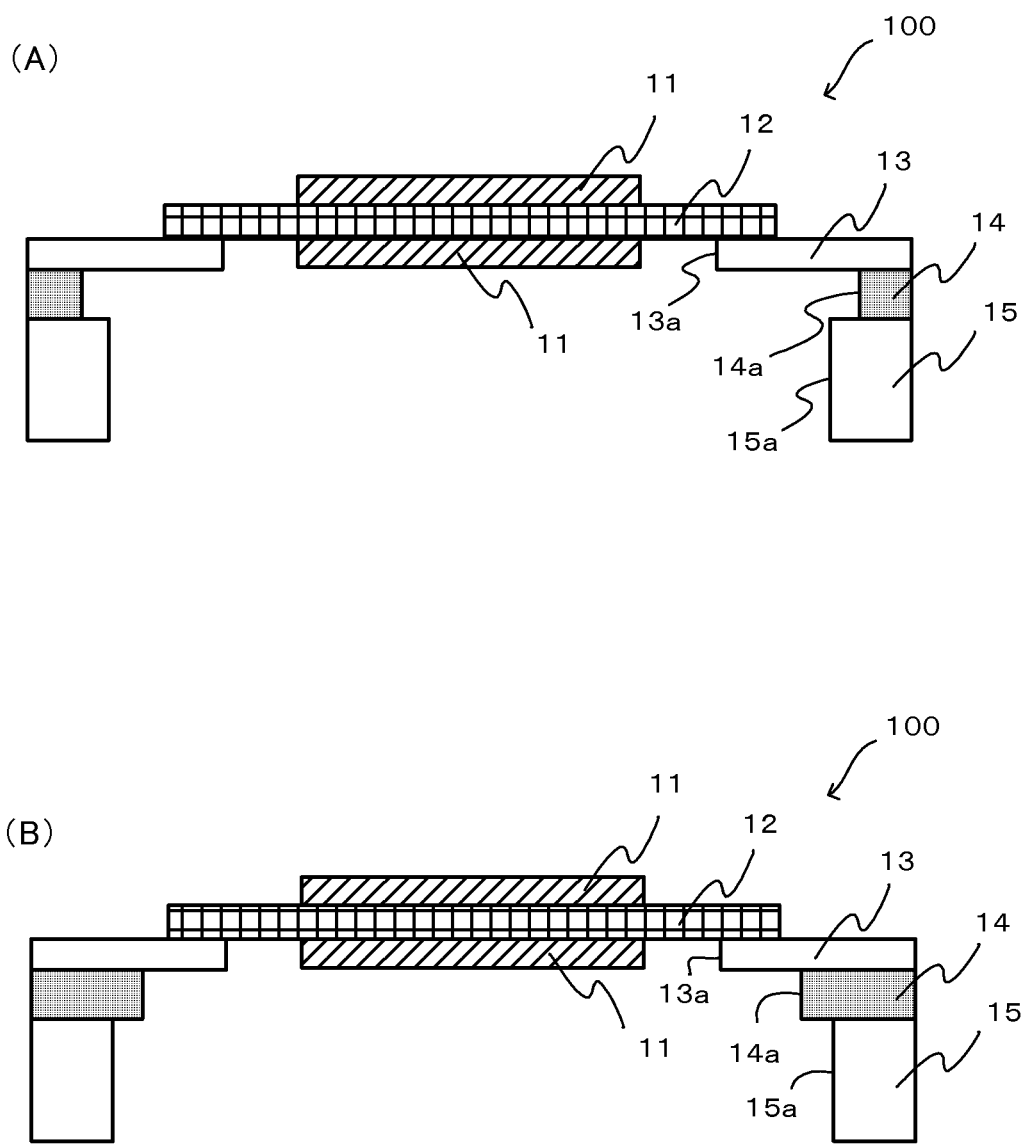
FIG. 8(A) is a cross-sectional view showing the piezoelectric actuator according to an modified embodiment of the present invention and (B) is a cross-sectional view showing the piezoelectric actuator according to another modified embodiment of the present invention.

In the above-described Embodiments 1 and 2, the opening 14a of the viscoelastic body 14 and the opening 15a of the support member 15 have a circular shape having the same diameter and circumference (see FIGS. 1 and 2(A)). However, this is not restrictive. The opening 14a of the viscoelastic body 14 can be larger in diameter than the opening 15a of the support member 15 as shown in FIG. 8(A), or the opening 14a of the viscoelastic body 14 can be larger in diameter than the opening 15a of the support member 15 as shown in FIG. 8(B). The viscoelastic body 14 having a small width in a cross-section as in the piezoelectric actuator 100 of FIG. 8(A) has lower rigidity D and serves to augment the vibration amplitude of the vibrating membrane 13; however, such a viscoelastic body 14 may make the production slightly more difficult. On the other hand, the viscoelastic body 14 having a large width in a cross-section as in the piezoelectric actuator 100 of FIG. 8(B) has the rigidity D higher than in the piezoelectric actuator 100 in FIG. 8(A) and causes the vibration amplitude of the vibrating membrane 13 to diminish. However, such a viscoelastic body 14 improves the resonance property attenuation function, flattens more the frequency property of the vibration amplitude, and makes the production easier.

In the above-described Embodiments 1 and 3, the viscoelastic bodies 14, 24, and 34 are overall annular, have a rectangular cross-section, and are made of elastomer such as silicon rubber to lower the rigidity D. However, the rigidity D of the viscoelastic bodies 14, 24, and 34 can be adjusted by changing their cross-section to some shape other than a rectangular.

Figure 9:
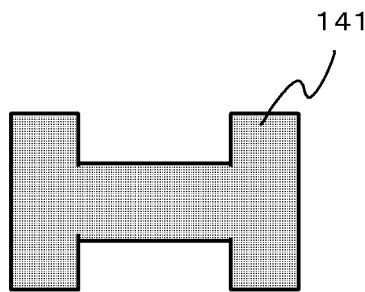
FIG. 9(A) to (E) are cross-sectional views showing the viscoelastic bodies of the piezoelectric actuator according to modified embodiments of the present invention.
Figure 9:
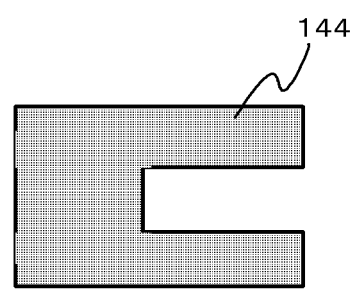
Figure 9:
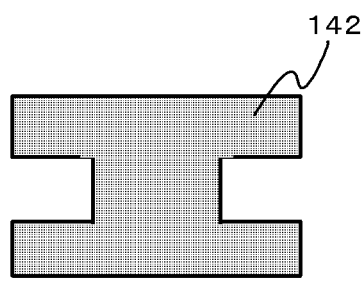
Figure 9:
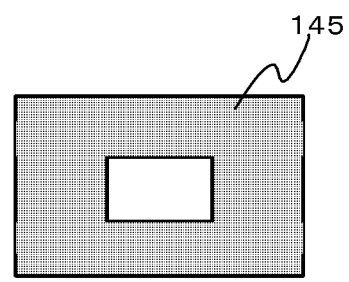
Figure 9:
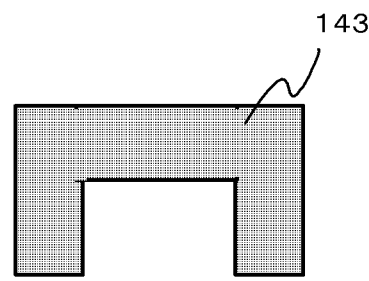

More specifically, FIGS. 9(A) to (E) show viscoelastic bodies 141 to 145 having cross-sections other than a rectangular. As shown in FIG. 9(A), a viscoelastic body 141 having an H-shaped cross-section efficiently converts the vertical elastic deformation of the viscoelastic body 141 in association with vibration of the piezoelectric vibrator 10 to shear deformation within the viscoelastic body 141. The shear deformation of the viscoelastic body 141 enhances the resonance property attenuation function and is further effective for flattening the frequency property of the vibration amplitude of the vibrating membranes 13 and 23 and vibrating membranes 130 and 136 described later of the actuators 100, 200a, 200b, 300a, and 300b and an actuator 400 described later. Furthermore, the viscoelastic body can be a viscoelastic body 142 having an I-shaped cross-section as shown in FIG. 9(B), a viscoelastic body 143 having an inverted U-shaped cross-section as shown in FIG. 9(C), or a viscoelastic body 144 having a C-shaped cross-section as shown in FIG. 9(D). Furthermore, the viscoelastic body can be a viscoelastic body 145 having an O-shaped cross-section like a tube as shown in FIG. 9(E). In the case of the viscoelastic body 145 having an O-shaped cross-section, adjusting the elasticity of the inner wall and the elasticity of the air contained in the hollow space leads to an improved degree of freedom in adjusting the rigidity D and Young's modulus E (damping ratio) of the viscoelastic body, and to improvement in the resonance property attenuation function due to friction between the inner wall of the viscoelastic body 145 and the contained air. Furthermore, the resonance property attenuation functionality can be adjusted by introducing a highly viscous liquid such as a glycerin solution in the hollow space of the viscoelastic body 145 shown in FIG. 9(E).

Figure 10:
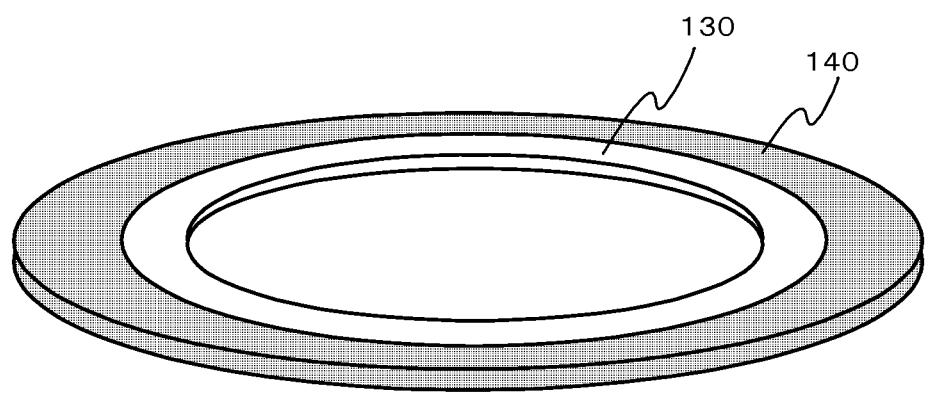
FIG. 10(A) is a perspective view showing the base and viscoelastic body of the piezoelectric actuator according to a modified embodiment of the present invention and (B) is a cross-sectional view showing the piezoelectric actuator according to the same modified embodiment.
Figure 10:
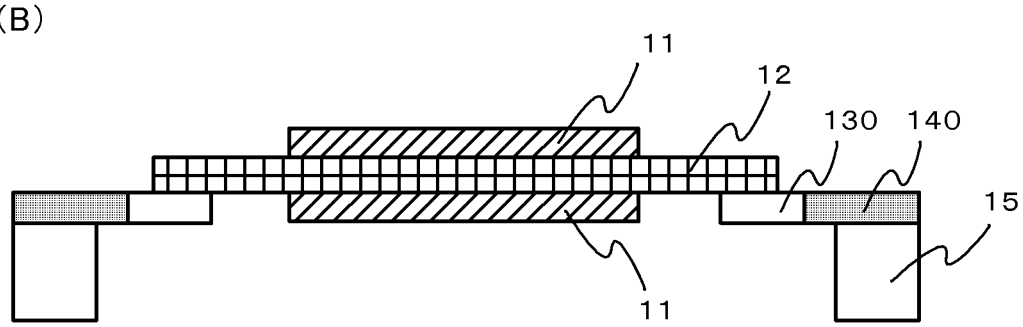

In the above-described Embodiments 1 and 2, the vibrating membrane 13 and viscoelastic bodies 14, 24, and 34 are stacked in the vertical direction. However, this is not restrictive. As shown in FIG. 10(A), the inner circumference surface of an annular viscoelastic body 140 having the rigidity D lower than a vibrating membrane 130 can integrally be joined to the outer circumference surface of the annular vibrating membrane 130. In such a case, as shown in FIG. 10(B), the outer peripheral part of the undersurface of the viscoelastic body 140 is joined to the top surface of the support member 15. The vibrating membrane 130 integrated with the viscoelastic body 140 as just described can be obtained by integral-molding the vibrating membrane 130 and viscoelastic body 140 using so-called insert molding (heterogeneous molding).

In the above-described Embodiments 1 and 2, the piezoelectric elements 11 and base 12 are circular and the vibrating membrane 13, viscoelastic body 14, and support member 15 are all annular (in the form of a circular frame). However, this is not restrictive. For example, as in a piezoelectric actuator 400 shown in FIG. 11, a vibrating membrane 136 having a rectangular outer shape and a viscoelastic body 146 and support member 156 in the form of a rectangular frame can be used.

Figure 12:
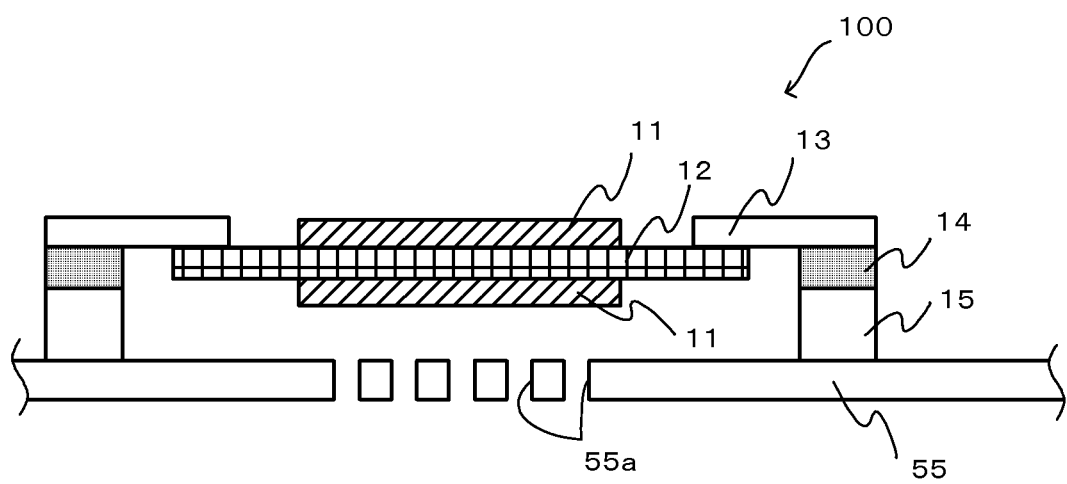
FIG. 12 is a cross-sectional view showing a usage of the piezoelectric actuator according to Embodiment 1 of the present invention.

The actuators 100, 200a, 200b, 300a, 300b, and 400 of the above-described Embodiments 1 and 2 are provided with the annular support member 15. However, this is not restrictive. The viscoelastic body 14 can directly be joined to the casing 55 of an electronic device; in other words, the support member 15 and the casing 55 of an electronic device can be integrated as shown in FIG. 12. In this way, the piezoelectric actuator 100 can have a smaller overall thickness, which is favorable for small electronic devices having a limited space to mount electronic parts. The material of the casing 55 of an electronic device can be various metal and resin materials, including ABS resin, polycarbonate resin, and stainless steel (SUS304).

As described above, the piezoelectric actuator 100 is supported by the casing 55 of an electronic device via the viscoelastic body 14 having rigidity lower than the vibrating membrane 13 and having the resonance property attenuation function. This structure prevents abnormal vibration accompanying the drive of the piezoelectric actuator 100 from transmitting to the electronic parts within an electronic device via the casing 55 of the electronic device and eliminates troubles such as improper operation and abnormal noise.

Furthermore, the above structure serves to attenuate detrimental vibration transmitted from the casing 55 of an electronic device, thereby protecting the piezoelectric actuator 100 from external vibration and/or impact.

EXAMPLES

As Examples, the piezoelectric and electrodynamic actuators (collectively "the actuators," hereafter) and actuators of modified examples were applied to an acoustic device for comparison. The results are shown in Table 1. The actuators were assessed as follows.

[Assessment Item 1: Normalized Resonance Frequency $\Delta f_S$]

The rated input, an alternating-current voltage of 1 (V), was applied to the actuators and the fundamental resonance frequency $f_0$ was measured. The fundamental resonance frequency $f_0$ is measured as a frequency when the sound pressure level has its peak in the frequency dependency of the sound pressure level (the vibration amplitude of the base 12 and vibrating membrane 13) as shown in FIG. 4(B). In Table 1, the fundamental resonance frequency of the piezoelectric actuator 101 of Modified Example 2 (see FIGS. 13 and 14) was used as the reference value $f_{OS}$ to obtain the normalized resonance frequency $\Delta f_S$ (%) ($=1-f_0/f_{OS}$)×100 (%) in which $f_0$ is the measured fundamental resonance frequency and $f_{OS}$ is the reference fundamental resonance frequency). Here, the alternating-current voltage of the same frequency and amplitude (voltage) was applied to the upper and lower piezoelectric elements 11 of the piezoelectric vibrator 10 of all actuators.

[Assessment Item 2: Normalized Sound Pressure Level]

The rated input, an alternating-current voltage of 1 (V), was applied to the actuators and the sound pressure level at an alternating-current voltage frequency of 500 Hz was measured. Table 1 shows the sound pressure level Lp (dB) ($=20\times \log_{10}(p/p_S)$ in which p is the measured sound pressure and $p_S$ is the reference sound pressure) normalized using the sound pressure p released from the piezoelectric actuator 101 of Modified Example 2 as the reference value $p_S$ ("the normalized sound pressure level Lp," hereafter). Here, the sound pressure p released from the actuators was measured using a microphone at a distance of 10 cm from where the actuator was.

[Assessment Item 3: Flatness of the Frequency Property of the Sound Pressure Level]

The frequency dependency of the above sound pressure level Lp (dB) was measured by applying the rated input, an alternating-current voltage of 1 (V), to the actuators and sweeping the frequency of the alternating-current voltage. The fluctuation range (Lp–Lp$_0$) of the sound pressure level Lp of the actuators was calculated using the sound pressure level Lp$_0$ at the fundamental resonance frequency $f_0$ as the reference value. Then, the flatness of the frequency property of the actuators was assessed based on the fluctuation range (Lp–Lp$_0$). In Table 1, "A," "B," and "C" indicate the fluctuation range (Lp–Lp$_0$) not exceeding 10 dB, exceeding 10 dB and not exceeding 15 dB, and exceeding 15 dB, respectively, in a frequency band of 1 kHz to 10 kHz. Here, as the fluctuation range (Lp–Lp$_0$) of the sound pressure level is smaller, the frequency property of the sound pressure level is flatter.

[Assessment Item 4: Drop Impact Resistant]

The actuators were each installed in a cell-phone and the cell-phone was dropped from a height of 50 cm and subjected to free-fall five times for assessing the drop impact resistance. More specifically, the sound pressure level Lp$_{0b}$ at the fundamental resonance frequency f$_0$ of the piezoelectric actuator before the impact and the sound pressure level Lp$_{0a}$ at the fundamental resonance frequency f$_0$ of the piezoelectric actuator after the impact were measured and the difference in sound pressure level |Lp$_{0b}$–Lp$_{0a}$| (dB) ("the sound pressure level difference," hereafter) was calculated. Then, as the sound pressure level difference Lp$_{0b}$–Lp$_{0a}$ is smaller, the cell-phone has higher impact resistance. In Table 1, "A" indicates the sound pressure level difference |Lp$_{0b}$–Lp$_{0a}$| not exceeding 3 dB and "B" indicates the sound pressure level difference |Lp$_{0b}$–Lp$_{0a}$| exceeding 3 dB.

TABLE 1

|  | normalized resonance frequency $\Delta f_S$ (%) | normalized sound pressure level Lp (dB) | sound pressure level frequency property flatness | drop impact resistance |
|---|---|---|---|---|
| Modified Example 1 | +38 | 0 | C | B |
| Modified Example 2 | 0 | +10 | B | A |
| Example 1 | −35 | +16 | B | A |
| Example 2 | −38 | +17 | B | A |
| Example 3 | −31 | +15 | A | A |
| Example 4 | −42 | +16 | B | A |
| Example 5 | −37 | +18 | A | A |
| Modified Example 3 | −23 | +14 | B | A |
| Example 6 | −33 | +15 | A | A |

Modified Example 1

Figure 15:
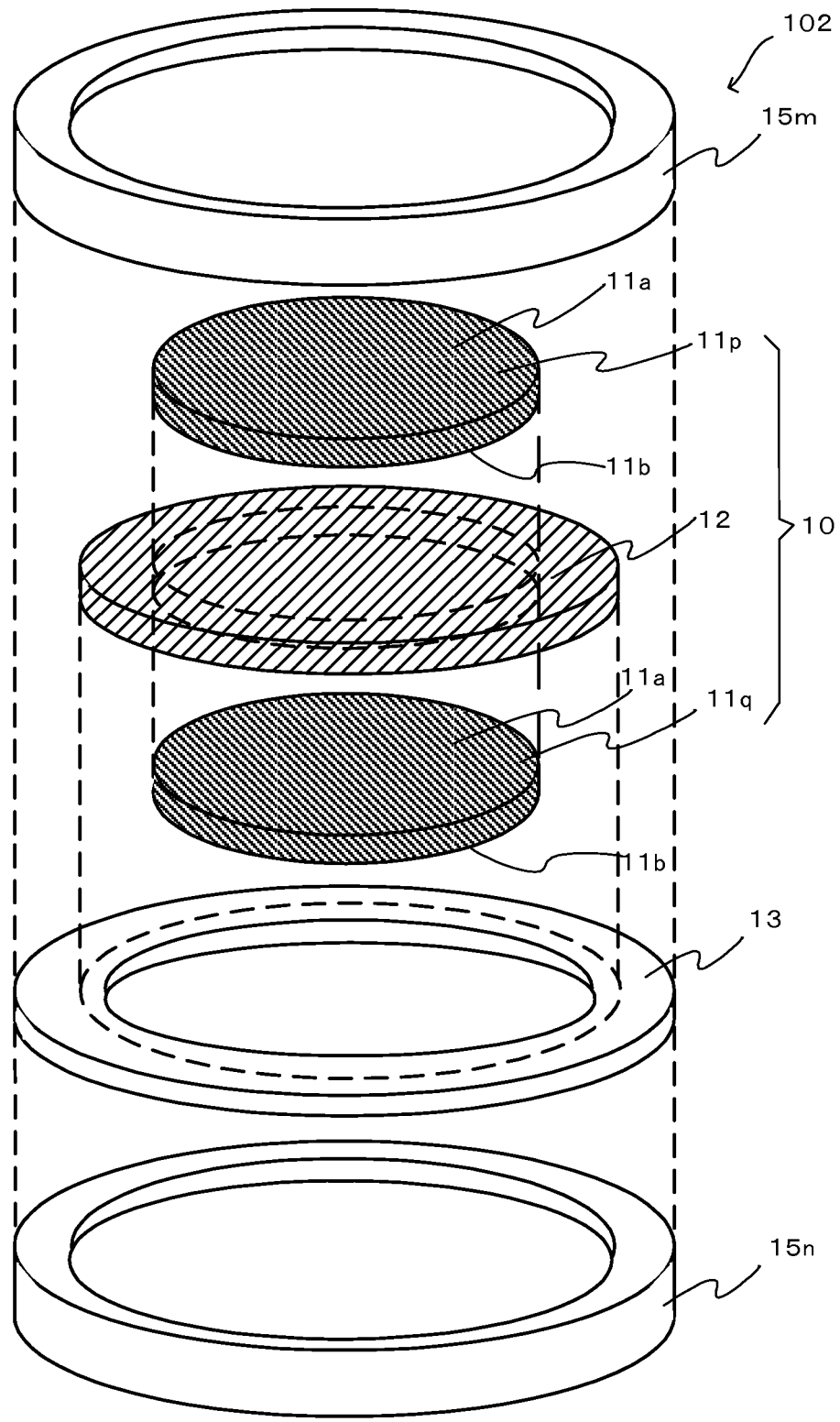
FIG. 15 is an exploded perspective view of the piezoelectric actuator according to another modified embodiment.
Figure 16:
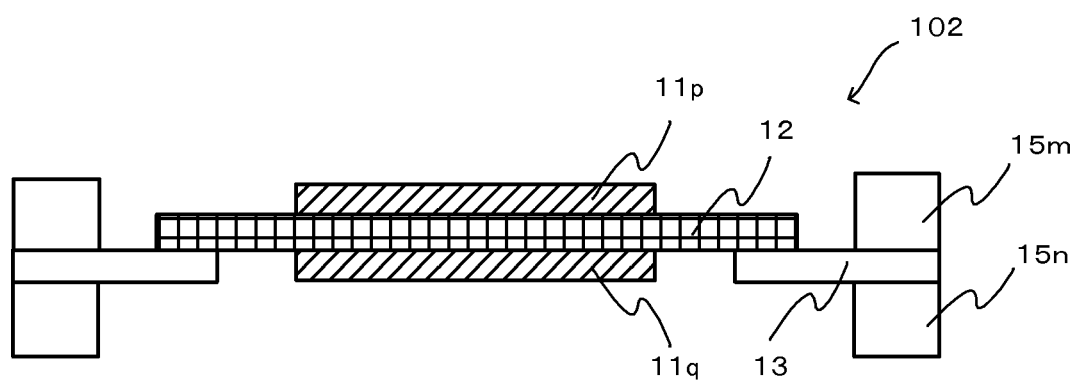
FIG. 16 is a cross-sectional view showing the piezoelectric actuator shown in FIG. 15.

As Modified Example 1, the vibration property assessment test was conducted on the piezoelectric actuator 102 shown in FIGS. 15 and 16.

A pair of upper and lower piezoelectric elements 11 of the piezoelectric vibrator 10 consists of first and second piezoelectric elements 11p and 11q both of which are disc-shaped. The first piezoelectric element 11p has a diameter of 18 mm and the second piezoelectric element 11q has a diameter of 17 mm. Both the first and second piezoelectric elements 11p and 11q have a thickness of 40 µm. Electrode layers 21a and 21b having a thickness of 8 µm are formed on the top surface and undersurface 11b of each of the piezoelectric elements 11 (11p and 11q), respectively (see FIG. 2(B)). The base 12 is made of phosphor bronze and in the form of a disc having a diameter of 20 mm and a thickness of 50 µm. The support member 15 is made of stainless steel (SUS304) and in the form of a ring (circular frame). The support member 15 has an outer diameter of 21 mm, an inner diameter (the radius of the opening 15a) of 20 mm, and a thickness of 0.5 mm.

The piezoelectric body of the piezoelectric elements 11 (11p and 11q) is a piezoelectric ceramic plate 21 made of a PZT ceramic (see FIG. 2(B)). The upper and lower electrode layers 21a and 21b of the piezoelectric elements 11 (11p and 11q) are made of a silver/palladium alloy (ratio by weight 7:3).

The piezoelectric elements 11 (11p and 11q) were fired in the atmosphere at a temperature of 1100° C. for two hours by a so-called green sheet method and, then, the piezoelectric ceramic plate 21 was treated for polarization. An epoxy adhesive was used to join the piezoelectric elements 11 (11p and 11q) and base 12 and the support member 15 and base 12.

Modified Example 2

As Modified Example 2, the vibration property assessment test was conducted on the piezoelectric actuator 101 shown in FIGS. 13 and 14(A).

Here, the piezoelectric elements 11, base 12, and support member 15 were made of the same kinds of materials as the piezoelectric elements 11 (11p and 11q), base 12, and support members 15m and 15n of the Modified Example 1 shown in FIGS. 15 and 16.

A pair of upper and lower piezoelectric elements 11 of the piezoelectric vibrator 10 consists of first and second piezoelectric elements 11p and 11q both of which are disc-shaped. The first piezoelectric element 11p has a diameter of 18 mm and the second piezoelectric element 11q has a diameter of 17 mm. Both the first and second piezoelectric elements 11p and 11q have a thickness of 40 µm. Electrode layers 21a and 21b having a thickness of 8 µm are formed on the top surface 11a and undersurface 11b of each of the piezoelectric elements 11 (11p and 11q), respectively (see FIG. 2(B)). The base 12 is made of phosphor bronze and in the form of a disc having a diameter of 20 mm and a thickness of 50 µm. The vibrating membrane 13 is made of a polyethylene terephthalate (PET) resin and in the form of a ring (circular frame) having an opening 13a. The vibrating membrane 13 has an outer diameter of 21 mm, an inner diameter of 18 mm, and a thickness of 25 µm. The support member 15 is made of stainless steel (SUS304) and in the form of a ring having an opening 15a. The support member 15 has an outer diameter of 21 mm, an inner diameter 20 mm, and a thickness of 0.5 mm.

The joint region between the inner peripheral part of the vibrating membrane 13 and the outer peripheral part of the base 12 is in the form of a ring having a width of 0.5 mm. Of the main surfaces of the base 12 (see FIG. 2(A)), the top surface of the vibrating membrane 13 is joined to the main surface (the undersurface) to which the second piezoelectric element 11q having a diameter 17 mm is joined.

The materials of the piezoelectric body and electrode layers constituting the piezoelectric element 11 and the process to produce the piezoelectric element 11 are the same as the piezoelectric actuator 102 of Modified Example 1. An epoxy resin adhesive was also used to join the components as in Modified Example 1. As shown in Table 1, needless to say, the normalized resonance frequency $\Delta f_S$ of Modified Example 2 is 0% because the fundamental resonance frequency of Modified Example 2 was used as the reference value as described above. In other words, the normalized resonance frequency $\Delta f_S$ of the piezoelectric actuator 101 of Modified Example 2 is as low as 0% while the noimalized resonance frequency $\Delta f_S$ of the piezoelectric actuator 102 of Modified Example 1 is 38%. In other words, the fundamental resonance frequency f$_0$ of Modified Example 2 is significantly low compared with that of Modified Example 1 and, as shown in Table 1, the normalized sound pressure level Lp is high. Both the flatness of the frequency property of the sound pressure level and the drop impact resistance were improved.

Example 1

As Example 1, the vibration property assessment test was conducted on the piezoelectric actuator 100 shown in FIGS. 1 and 2(A). The specific structure of the components of the piezoelectric actuator 100 is as follows. Here, the piezoelectric elements 11 (11p and 11q), base 12, vibrating membrane 13, and support member 15 are the same in shape and material as those in Modified Example 2.

The viscoelastic body 14 is made of silicon rubber having a hardness of 60 and in the form of a ring having an opening 14a. The viscoelastic body 14 has an outer diameter of 21 mm, an inner diameter of 18 mm, and a thickness of 250 μm. An epoxy resin adhesive was used to join the components as in Modified Example 1 except for joining the viscoelastic body 14 to other members. A silicon adhesive was used to join the viscoelastic body 14 to other members.

As shown in Table 1, the piezoelectric actuator 100 of Example 1 had the normalized resonance frequency $\Delta f_S$ of −35%, which is further lower than that (0%) of the piezoelectric actuator 101 of Modified Example 2. Furthermore, compared with the Modified Example 2, the normalized sound pressure level Lp was higher and both the flatness of the frequency property of the sound pressure level and the drop impact resistance were improved.

The above results confirmed that the vibration property obtained by the piezoelectric actuator 101 of Modified Example 1 can be realized by the piezoelectric actuator 100 that is smaller in size (space to occupy).

Example 2

In Example 2, the piezoelectric actuator 100 having the same structure as in Example 1 was used except that the viscoelastic body 14 has a C-shaped cross-section (see FIG. 9(D)). The vibration property assessment test was conducted on the piezoelectric actuator 100 of Example 2.

As shown in Table 1, compared with the piezoelectric actuator 100 of Example 2, the piezoelectric actuator 100 of Example 2 had the normalized resonance frequency $\Delta f_S$ further lowered to −38% from −35%. Consequently, the normalized sound pressure level Lp when the alternating-current voltage applied to the piezoelectric elements 11 (11p and 11q) has a frequency of 500 Hz was further higher. Then, the flatness of the frequency property of the sound pressure level and the drop impact resistance were excellent as in Example 1.

Example 3

In the piezoelectric actuator 200a according to Example 3, the first and second viscoelastic bodies 24 and 34 made of different materials are joined to the top surface and undersurface of the vibrating membrane 13 as shown in FIG. 6(A) instead of the viscoelastic body 14 being joined only to the undersurface of the vibrating membrane 13. The piezoelectric actuator 200a of Example 3 is the same in the other structure as the piezoelectric actuator 100 of Example 1. The vibration assessment test was conducted on this piezoelectric actuator 200a. In the following explanation, the same components are referred to by the same or corresponding reference numbers and their explanation is omitted unless otherwise noted.

Both the first and second viscoelastic bodies 24 and 34 are annular like the viscoelastic body 14 of Example 1. The first viscoelastic body 24 is made of the same silicon rubber having a hardness of 60 as in Example 1 and the second viscoelastic body 34 is made of silicon rubber having a hardness of 30.

As shown in Table 1, compared with the piezoelectric actuator 100 of Example 1, the piezoelectric actuator 200a of Example 3 had the flatness of the frequency dependency of the sound pressure level improved. Furthermore, in Example 3, as in Example 1, the normalized resonance frequency $\Delta f_S$ was further lowered from Modified Example 2. Consequently, the normalized sound pressure level Lp of the piezoelectric actuator 100 when the alternating-current voltage applied to the piezoelectric elements 11 (11p and 11q) had a frequency of 500 Hz was further higher. Then, the flatness of the frequency property of the sound pressure level and the drop impact resistance were excellent as in Example 1.

Example 4

Figure 11:
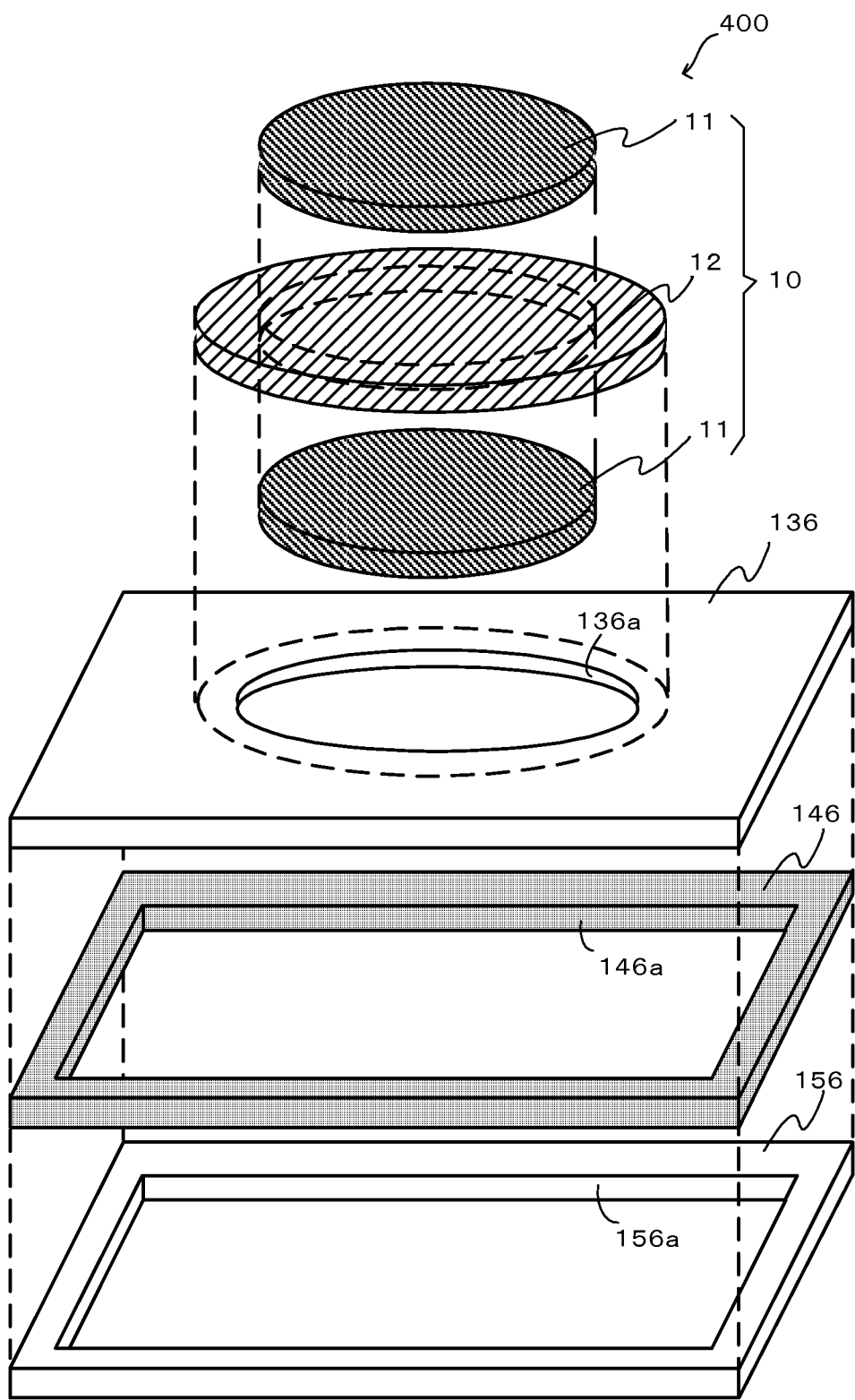
FIG. 11 is an exploded perspective view showing the piezoelectric actuator according to a modified embodiment of the present invention.

As Example 4, the vibration property assessment test was conducted on the piezoelectric actuator 400 shown in FIG. 11. The piezoelectric actuator 400 has a vibrating membrane 136 having a rectangular outer shape and a viscoelastic body 146 and support member 156 each in the form of a rectangular frame. The piezoelectric actuator 400 has the same in the other structure as the piezoelectric actuator 100 of Example 1. In the following explanation, the same components are referred to by the same or corresponding reference numbers and their explanation is omitted unless otherwise noted.

The vibrating membrane 136 had a square outer shape of 21 mm on a side with a circular opening 136a having a diameter 18 mm at the center. The viscoelastic body 146 and support member 156 were each in the form of a square frame having an opening 146a or 156a, of which the outer square was 21 mm on a side and the inner square was 20 mm on a side.

The piezoelectric actuator 400 in Example 4 was increased in size (the area of the vibrating membrane 136) compared with Example 1. Therefore, the piezoelectric actuator 400 had the normalized resonance frequency $\Delta f_S$ lowered as its overall rigidity lowered. The normalized sound pressure level Lp was high. The flatness of the frequency property of the sound pressure level and the drop impact resistance were excellent as in Example 1.

Example 5

A cell-phone according to Example 5 was prepared by installing the piezoelectric actuator 100 of Example 1 in a cell-phone as an electronic device as shown in FIG. 12. The casing 55 of the cell-phone was made of ABC resin and had a thickness of 1 mm. The casing 55 had nine thorough-holes 55a having a diameter of 1 mm to release sound waves generated by the vibration of the piezoelectric actuator 100 outside. As shown in FIG. 12, the cell-phone according to Example 5 was constructed by joining the support member 15 to the casing 55 of the cell-phone. The vibration property as an acoustic device of the cell-phone was assessed. In Example 5, the normalized sound pressure level Lp, flatness of the frequency property of the sound pressure level, and drop impact resistance were excellent as in Example 1. No detrimental vibration was transmitted in the cell-phone while the piezoelectric actuator 100 was driven; the resonance property attenuation function of the viscoelastic body 14 was confirmed excellent.

Modified Example 3

As Modified Example 3, the vibration property assessment test was conducted on the electrodynamic actuator 300b shown in FIG. 7(B). The electrodynamic actuator 300b comprises a yoke 35 as a support member in the form of a closed-end cylinder, a permanent magnet 31 provided at the center of the inner bottom of the yoke 35, a cylindrical member 32a surrounding the permanent magnet 31 and on the outer periphery of which a coil 32 is wound, and a vibrating membrane 23 at the center of the undersurface of which the cylindrical member 32a is joined.

The outer peripheral part of the undersurface of the vibrating membrane 23 is joined to the yoke 35 via a stainless steel (SUS304) spacer 54 having the rigidity D higher than the vibrating membrane 23.

Here, the vibrating membrane 23 was made of polyethylene terephthalate (PET) resin and in the form of a ring having a diameter 16 mm and a thickness of 25 μm. The spacer 54 corresponding to the viscoelastic body 14 of the electrodynamic actuator 300a was in the form of a ring having an outer diameter 16 mm, an inner diameter of 15 mm, and a thickness of 250 μm.

An alternating-current voltage containing sound signals was applied to the coil 32 in the state shown in FIG. 7(B) so that an electromagnetic force acted between the permanent magnet 31 and energized coil 32. Consequently, the vibrating membrane 23 vibrated and the sound corresponding to the sound signals was reproduced. The assessment results will be given later in comparison with Example 6 below.

Example 6

As Example 6, the vibration property assessment test was conducted on the electrodynamic actuator 300a shown in FIG. 7(A).

Here, Example 6 has the same structure as Modified Example 3 except for the viscoelastic body 14 being made of silicon rubber having a hardness of 30. In this way, the viscoelastic body 14 in Example 6 has the rigidity D lower than the vibrating membrane 23 so as to exert the resonance property attenuation function. Then, as shown in Table 1, compared with Modified Example 3, the normalized resonance frequency $\Delta f_S$ lowered and the normalized sound pressure level Lp was high. Here, the flatness of the frequency property of the sound pressure level was excellent compared with Modified Example 3. The drop impact resistant was as good as in Modified Example 3.

Various embodiments and modifications are available to the present invention without departing from the broad sense of spirit and scope of the present invention. The above-described embodiments are given for explaining the present invention and do not confine the scope of the present invention. In other words, the scope of the present invention is set forth by the scope of claims, not by the embodiments. Various modifications made within the scope of claims and scope of significance of the invention equivalent thereto are considered to fall under the scope of the present invention.

This application is based on Japanese Patent Application No. 2009-283894 filed on Dec. 15, 2009, and including specification, claims, drawings and summary. The disclosure of the above Japanese Patent Application is incorporated herein by reference in its entirety.

Legend
10 Piezoelectric vibrator
11, 11p, 11q Piezoelectric element
12 Base
13 Vibrating membrane
14 Viscoelastic body (vibration direction converter)
15, 25 Support member (frame)
21 Piezoelectric ceramic plate (piezoelectric body)
23 Vibrating membrane
55 Casing of electronic device (cell-phone)
100, 101, 102, 200a, 200b, 400 Piezoelectric actuator
300, 300a, 300b Electrodynamic actuator

The invention claimed is:

1. A piezoelectric actuator, comprising:
a piezoelectric vibrator composed of a piezoelectric element and a base vibrated by the piezoelectric element;
a vibrating membrane joined to the outer peripheral part of a main surface of the base and vibrating in association with vibration of the piezoelectric vibrator;
a support member supporting the vibrating membrane; and
a first vibration direction converter interposed between the vibrating membrane and support member and deforming to convert vibration of the vibrating membrane in the surface direction parallel to its main surfaces to vibration of the vibrating membrane in the direction nearly perpendicular to the surface direction,
a second vibration direction converter that is different in rigidity from the first vibration direction converter,
wherein one surface of the first vibration direction converter is joined to the supporting member, and another surface opposing to the one surface is joined to the main surface of the vibrating membrane, and
wherein the vibrating membrane is clamped by the first vibration direction converter and the second vibration direction converter.

2. The piezoelectric actuator according to claim 1, wherein:
the piezoelectric element is composed of a planar piezoelectric body and a pair of conductors formed on either side of the piezoelectric body, and vibrates upon input of alternating-current signals to the pair of conductors.

3. The piezoelectric actuator according to claim 1, wherein:
the piezoelectric element and base are circular in a plane view, the piezoelectric element is smaller in area than a region defined by the circumference of the base, and the piezoelectric element and base are coaxially stacked.

4. The piezoelectric actuator according to claim 1, wherein:
the vibrating membrane is annular with an opening at the center; and
the outer peripheral part of a main surface of the base is joined coaxially with the peripheral edge region of the opening of the vibrating membrane.

5. The piezoelectric actuator according to claim 1, wherein:
the vibrating membrane and base are integral-molded using an insert molding method.

6. The piezoelectric actuator according to claim 1, wherein:
the vibrating membrane has rigidity higher than the first vibration direction converter and lower than the base.

7. The piezoelectric actuator according to claim 1, wherein:
one of the first and second vibration direction converters is secured to the support member.

8. The piezoelectric actuator according to claim 1, wherein:
the first vibration direction converter is made of a composite material from two or more materials that are different in rigidity.

9. The piezoelectric actuator according to claim 1, wherein:
the first vibration direction converter is made of a viscoelastic body.

10. The piezoelectric actuator according to claim 1, wherein:
the first vibration direction converter is made of silicon rubber.

11. The piezoelectric actuator according to claim 1, wherein:
the first vibration direction converter has an O-shaped cross-section.

12. The piezoelectric actuator according to claim 1, wherein:
the first vibration direction converter is joined to a main surface of the vibrating membrane or to the outer circumference surface of the vibrating membrane.

13. An actuator, comprising:
a vibration generator generating vibration upon input of drive signals;
a vibrating membrane joined to the vibration generator and vibrating in association with vibration of the vibration generator;
a support member supporting the vibrating membrane; and
a first vibration direction converter interposed between the vibrating membrane and support member and deforming to convert vibration of the vibrating membrane in the surface direction parallel to its main surfaces to vibration of the vibrating membrane in the direction nearly perpendicular to the surface direction,
a second vibration direction converter that is different in rigidity from the first direction converter,
wherein one surface of the first vibration direction converter is joined to the supporting member, and another surface opposing to the one surface is joined to the main surface of the vibrating membrane, and
wherein the vibrating membrane is clamped by the first vibration direction converter and the second vibration direction converter.

14. The actuator according to claim 13, wherein:
the vibration generator is composed of an electrodynamic converter containing a permanent magnet and a coil.

15. An electronic device in which the piezoelectric actuator according to claim 1 or the actuator according to claim 13 is installed as a vibration device.

16. An electronic device in which the piezoelectric actuator according to claim 1 or the actuator according to claim 14 is installed as an acoustic device.

17. A vibration attenuation and vibration direction conversion method, wherein:
a first viscoelastic body is interposed between a vibrating membrane vibrating in association with vibration of a vibration generator and a support member supporting the vibrating membrane,
the vibrating membrane is clamped by the first viscoelastic body and a second viscoelastic body that s different in rigidity from the e first viscoelastic body; and
the first viscoelastic body is deformed by vibration of the vibrating membrane so as to attenuate vibration transmitted from the support member to the vibrating membrane and convert vibration of the vibrating membrane in the surface direction parallel to its main surfaces to vibration of the vibrating membrane in the direction nearly perpendicular to the surface direction,
wherein one surface of the first viscoelastic body is joined to the supporting member, and another surface opposing to the one surface is joined to the main surface of the vibrating membrane.

* * * * *

UNITED STATES PATENT AND TRADEMARK OFFICE
CERTIFICATE OF CORRECTION

PATENT NO. : 9,137,608 B2
APPLICATION NO. : 13/513953
DATED : September 15, 2015
INVENTOR(S) : Masatake Takahashi et al.

It is certified that error appears in the above-identified patent and that said Letters Patent is hereby corrected as shown below:

In the specification

Column 17, Line 28: delete "ratio)" and insert -- ratio $\zeta$) --

Column 19, Line 20: delete "$Lp_{0b}$" and insert -- $| Lp_{0b}$ --

Column 20, Line 62: delete "noimalized" and insert -- normalized --

In the claims

Column 25, Line 28: In Claim 13, delete "first" and insert -- first vibration --

Column 26, Line 11: In Claim 16, delete "claim 14" and insert -- claim 13 --

Column 26, Line 19: In Claim 17, delete "that s" and insert -- that is --

Column 26, Line 20: In Claim 17, delete "the e" and insert -- the --

Signed and Sealed this
First Day of March, 2016

Michelle K. Lee
*Director of the United States Patent and Trademark Office*